US010536155B1

(12) United States Patent
Otte

(10) Patent No.: US 10,536,155 B1
(45) Date of Patent: Jan. 14, 2020

(54) HISTOGRAM-BASED QUALIFICATION OF DATA USED IN BACKGROUND OR BLIND CALIBRATION OF INTERLEAVING ERRORS OF TIME-INTERLEAVED ADCS

(71) Applicant: Analog Devices, Inc., Norwood, MA (US)

(72) Inventor: Eric Otte, Boston, MA (US)

(73) Assignee: ANALOG DEVICES, INC., Norwood, MA (US)

(*) Notice: Subject to any disclaimer, the term of this patent is extended or adjusted under 35 U.S.C. 154(b) by 0 days.

(21) Appl. No.: 16/138,886

(22) Filed: Sep. 21, 2018

(51) Int. Cl.
  *H03M 1/06* (2006.01)
  *H03M 1/10* (2006.01)
  *G06F 11/07* (2006.01)

(52) U.S. Cl.
  CPC ......... *H03M 1/1009* (2013.01); *G06F 11/079* (2013.01); *G06F 11/0736* (2013.01); *G06F 11/0751* (2013.01); *G06F 11/0793* (2013.01); *H03M 1/0602* (2013.01)

(58) Field of Classification Search
  CPC ........ H03M 1/1009; H03M 1/12; H03M 1/06; H03M 1/1023; H03M 1/203; H03M 1/207; H03M 1/10; H03M 2201/63; H03M 3/38; H03M 1/0602; G06F 11/0751; G06F 11/0793; G06F 11/0736; G06F 11/079
  USPC ......................................... 341/155, 118, 120
  See application file for complete search history.

(56) References Cited

U.S. PATENT DOCUMENTS

| | | | | |
|---|---|---|---|---|
| 6,344,810 | B2 * | 2/2002 | Velazquez | H03M 1/0614 341/118 |
| 8,816,886 | B1 * | 8/2014 | Warner | H03M 1/1057 341/120 |
| 8,952,835 | B1 * | 2/2015 | Zortea | H03M 1/0809 341/118 |
| 9,029,825 | B2 * | 5/2015 | Tada | G11C 13/0007 257/4 |
| 9,385,737 | B1 * | 7/2016 | Yu | H03M 1/0624 |
| 9,608,652 | B2 * | 3/2017 | Lee | H03M 1/002 |
| 2008/0100483 | A1 * | 5/2008 | Pupalaikis | H03M 1/1009 341/118 |

(Continued)

OTHER PUBLICATIONS

Lee et al., *A 1 GS/s 10b 18.9 mW Time-Interleaved SAR ADC with Background Timing Skew Calibration*, IEEE Journal of Solid-State Circuits, vol. 49, No. 12, Dec. 2014, 11 pages.

(Continued)

*Primary Examiner* — Jean B Jeanglaude
(74) *Attorney, Agent, or Firm* — Patent Capital Group

(57) ABSTRACT

An ADC can include a plurality of time-interleaved ADCs to increase the overall sampling rate of the ADC. Such an ADC can have interleaving errors, since the time-interleaved ADCs in the ADC are not always perfectly matched. One way to calibrate for these mismatches is by observing the digital output signals of the time-interleaved ADCs in the background, or more broadly, without knowledge of the input signal to the ADC (often referred to as "blind" calibration). Due to the nature of these calibrations, the performance of the calibration would significantly degrade when the input signal has certain problematic input conditions, such as a certain coherent input frequency. To address this issue, the data being used for calibration of interleaving errors can go through a qualifying process to assess whether to update error estimates based on the data.

24 Claims, 16 Drawing Sheets

(56) References Cited

U.S. PATENT DOCUMENTS

2016/0182073 A1    1/2016  Speir et al.
2017/0041013 A1    2/2017  Nagarajan et al.

OTHER PUBLICATIONS

El-Chammas et al., *A 12-GS/s 81-mW 5-bit Time-Interleaved Flash ADC with Background Timing Skew Calibration*, IEEE Journal of Solid-State Circuits, vol. 46, No. 4, Apr. 2011, 10 pages.

\* cited by examiner

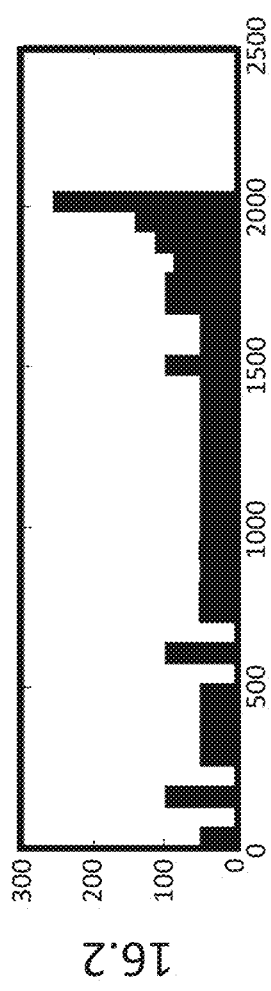
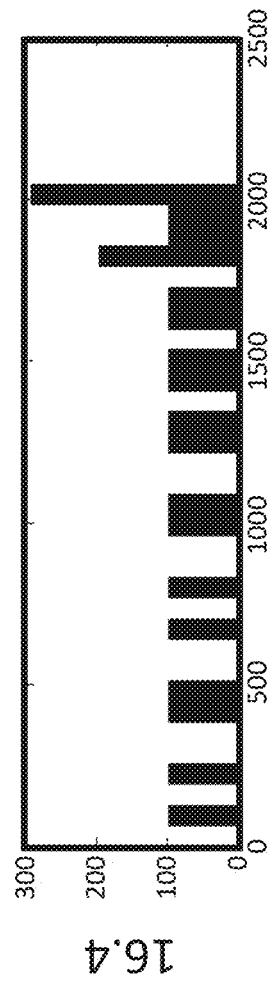
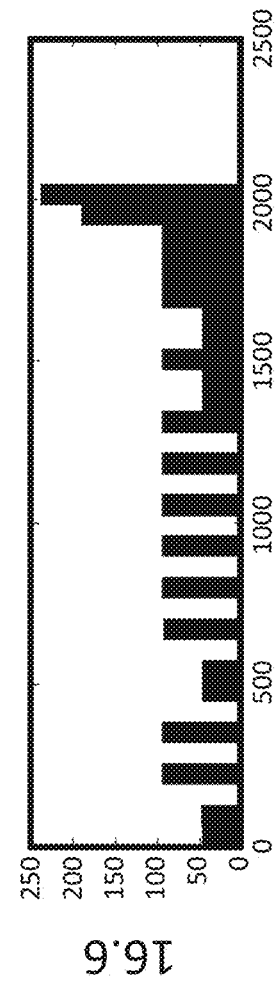
FIGURE 11A
FIGURE 11B
FIGURE 11C

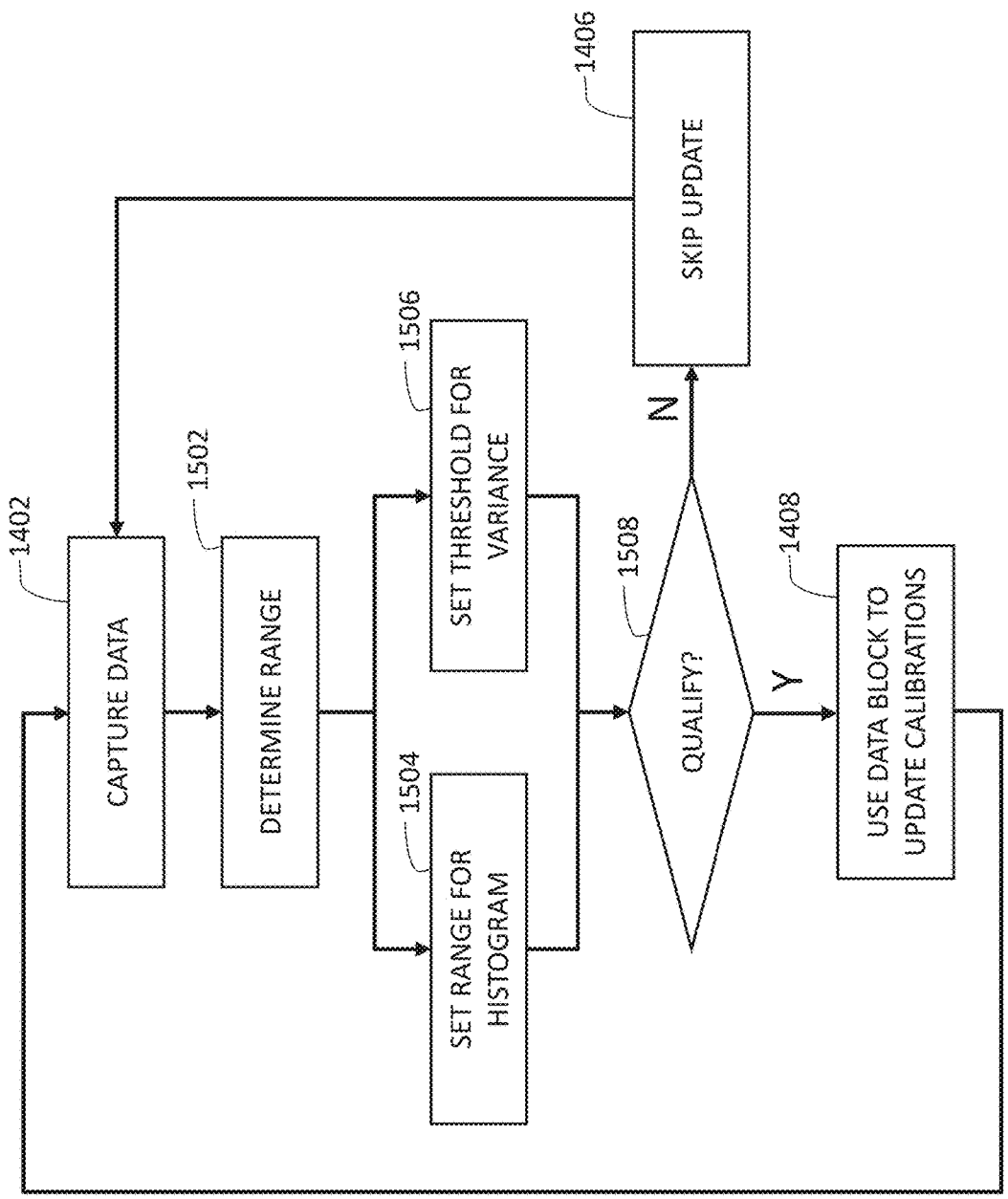

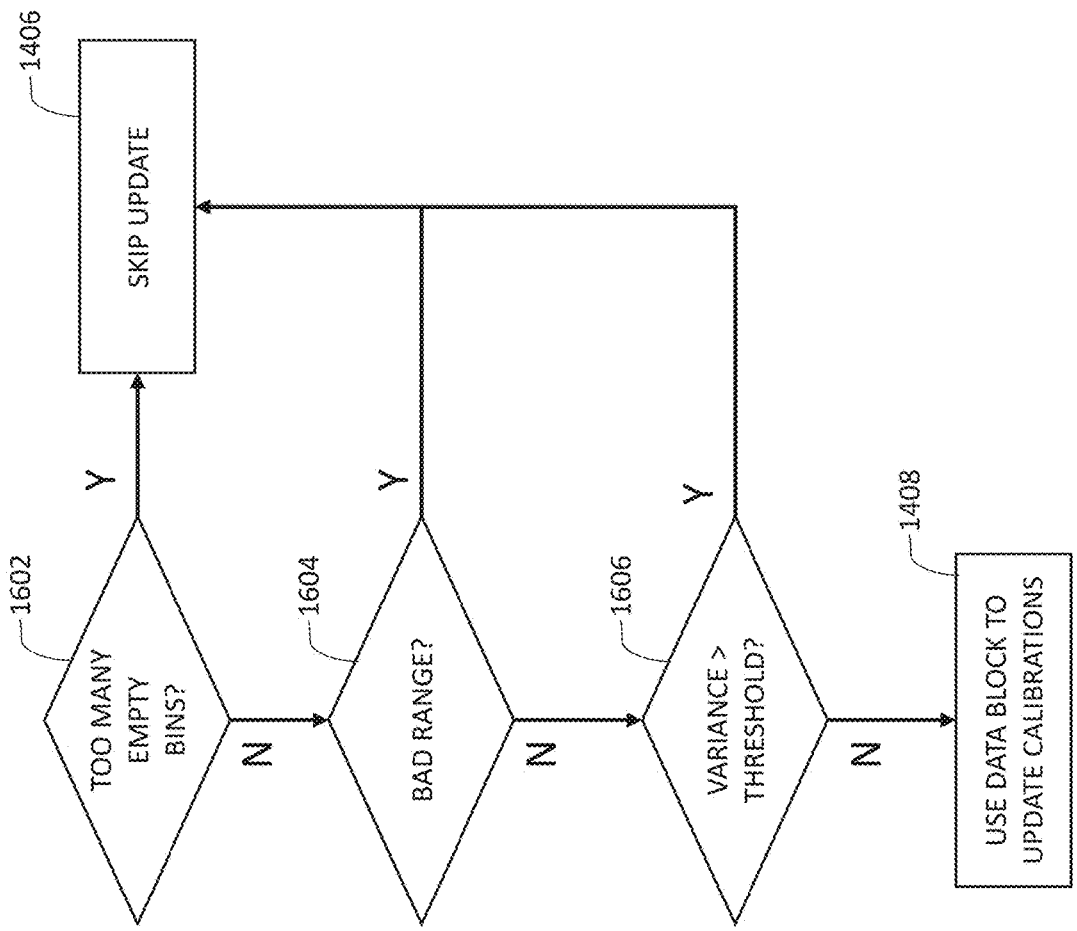

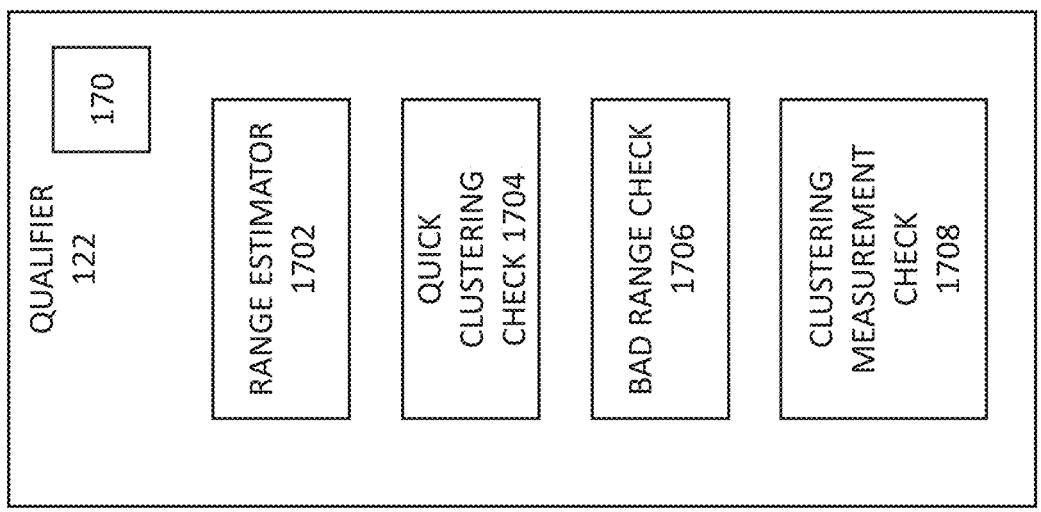

US 10,536,155 B1

HISTOGRAM-BASED QUALIFICATION OF DATA USED IN BACKGROUND OR BLIND CALIBRATION OF INTERLEAVING ERRORS OF TIME-INTERLEAVED ADCS

FIELD OF THE DISCLOSURE

The present invention relates to the field of integrated circuits, in particular to techniques used in background or blind calibrations of interleaving errors of time-interleaved analog-to-digital converters.

BACKGROUND

In many electronics applications, an analog-to-digital converter (ADC) converts an analog input signal to a digital output signal, e.g., for further digital signal processing or storage by digital electronics. Broadly speaking, ADCs can translate analog electrical signals representing real-world phenomenon, e.g., light, sound, temperature, electromagnetic waves, or pressure for data processing purposes. For instance, in measurement systems, a sensor makes measurements and generates an analog signal. The analog signal would then be provided to an ADC as input to generate a digital output signal for further processing. In another instance, a transmitter generates an analog signal using electromagnetic waves to carry information in the air or a transmitter transmits an analog signal to carry information over a cable. The analog signal is then provided as input to an ADC at a receiver to generate a digital output signal, e.g., for further processing by digital electronics.

Due to their wide applicability in many applications, ADCs can be found in places such as broadband communication systems, audio systems, receiver systems, etc. Designing an ADC is a non-trivial task because each application may have different needs in performance, power, cost and size. ADCs are used in a broad range of applications including Communications, Energy, Healthcare, Instrumentation and Measurement, Motor and Power Control, Industrial Automation and Aerospace/Defense. As the applications needing ADCs grow, the need for fast yet accurate conversion also grows. Designing an ADC can be a complex and challenging task.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIGS. 7A-B, 8A-B, 9A-B, 10A-B, and 11A-G are histograms of digital output signals generated from input signals having various frequencies, according to some embodiments of the disclosure;

FIG. 15 is a flow diagram illustrating another exemplary method for qualifying data used for background/blind calibration of interleaving errors, according to some embodiments of the disclosure;

FIG. 16 is a flow diagram illustrating an exemplary method for qualifying a block of data, according to some embodiments of the disclosure; and FIG. 17 illustrates exemplary components within a qualifier 122, which can be used to implement one or more parts of FIGS. 15 and 16, according to some embodiments of the disclosure.

DETAILED DESCRIPTION

Overview

An ADC can include a plurality of time-interleaved ADCs to increase the overall sampling rate of the ADC. Such an ADC can have interleaving errors, since the time-interleaved ADCs in the ADC are not always perfectly matched. For instance, the time-interleaved ADCs can often have offset mismatches, gain mismatches, and timing skew. One way to calibrate for these mismatches is by observing the digital output signals of the time-interleaved ADCs in the background, or more broadly, without knowledge of the input signal to the ADC (often referred to as "blind" calibration). Due to the nature of these calibrations, the performance of the calibration would significantly degrade when the input signal has certain problematic input conditions, such as a certain coherent input frequency. These problematic input conditions can cause the calibrations to diverge. To address this issue, the data being used for calibration of interleaving errors can go through a qualifying process to assess whether to update error estimates based on the data. The qualifying process can detect whether the input signal has a problematic input condition or meets certain requirements for the calibration, such as diversity in amplitude levels in the data.

Basics of ADCs

ADCs are electronic devices that convert a continuous physical quantity carried by an analog signal to a digital output or number that represents the quantity's amplitude (or to a digital signal carrying that digital number). An ADC can be defined by the following application requirements: its bandwidth (the range of frequencies of analog signals it can properly convert to a digital signal) and its resolution (the number of discrete levels the maximum analog signal can be divided into and represented in the digital signal). An ADC also has various specifications for quantifying ADC dynamic performance, including signal-to-noise-and-distortion ratio SINAD, effective number of bits ENOB, signal to noise ratio SNR, total harmonic distortion THD, total harmonic distortion plus noise THD+N, and spurious free dynamic range SFDR. ADCs have many different designs, which can be chosen based on the application requirements and specifications.

Understanding Time-Interleaved ADCs

Figure 1:
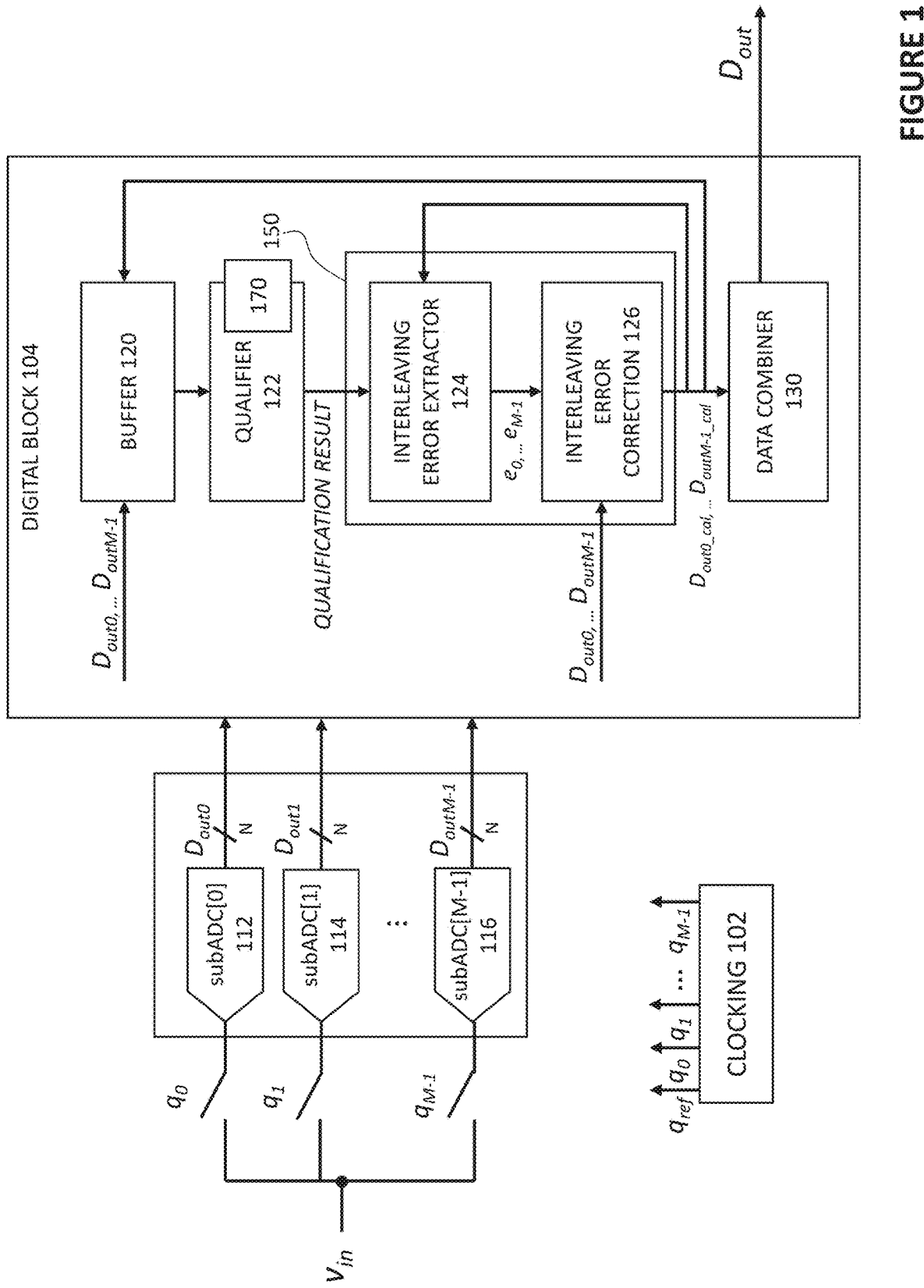
FIG. 1 shows an exemplary ADC having M time-interleaved ADCs and digital processing for processing outputs of the M time-interleaved ADCs, according to some embodiments of the disclosure.

Time-interleaving is a technique used to increase the sample rate of an ADC. Many (low-speed) ADCs can be used in parallel, operating to sample an analog input one after another (in a time-interleaved fashion). Using appropriate clocking to control the time-interleaved ADCs can greatly increase the effective, combined ADC sampling rate. FIG. 1 shows an exemplary ADC having M time-interleaved ADCs and digital processing for processing outputs of the M time-interleaved ADCs, according to some embodiments of the disclosure. The M time-interleaved ADCs are shown as $ADC_0$ to $ADC_{M-1}$ (sometimes referred herein as sub-ADCs). The example shown includes subADC[0] 112, subADC[1] 114, . . . and subADC[M−1] 116. Together, with appropriate clocking, the M sub-ADCs can provide an effective sampling rate that is higher than a sampling rage of a single sub-ADC alone. The appropriate clocking can be provided by clocking block 102 to produce clock signals or selection signals, $q_0, q_1, \ldots q_{M-1}$, having different phases, to select one of the M sub-ADCs for sampling the analog input signal $v_{in}$ for a given cycle and converting the analog input signal $v_{1n}$ to a digital output signal. Phrased differently, the clocking block 102 can produce selection signals triggering the M sub-ADCs in the ADC to sample the analog input signal $v_{in}$. M can be greater than or equal to two. The M sub-ADCs sample the input signal $v_{in}$ one after another and produce corresponding digital output signals, $D_{out0}, D_{out1}, \ldots D_{outM-1}$, respectively, which are then combined by the digital block 104 to produce the (final) digital output signal $D_{out}$.

In one example, the M sub-ADCs can operate in a round-robin fashion or sequential fashion, where the M sub-ADCs samples the input based on a fixed sequence in sequential manner. When sampling the analog input signal $v_{in}$ in a sequential manner, the M sub-ADCs are sampling the analog input signal $v_{in}$ according to a rotational sequence. The order of sampling is fixed, and the rotational sampling sequence repeats the order of sampling. Each sub-ADC can operate at $F_S/M$, where $F_S$ is the effective sample rate of the ADC.

While time-interleaving is often used to increase the sampling rate of ADCs, time-interleaving can introduce interleaving errors when the interleaved sub-ADCs have mismatches. For instance, the interleaving errors can be caused by offset mismatch, gain mismatch, and timing skew. Specifically, the type of sequential interleaving described above suffers from the property that any mismatches between the M sub-ADCs would show up in the ADC output frequency spectrum (e.g., a spectrum generated by a Fast Fourier Transform) as spurs in discrete frequency bins with large concentrated energy content. These spurs can be undesirable for many applications, and can significantly affect the dynamic performance of the time-interleaved ADC.

To address this issue, time-interleaved ADCs can operate in a pseudo-randomized fashion, so that the spurs can be "spread over the noise floor". The spurs move from being spikes at certain frequencies to shaped "humps" in the noise floor. To implement pseudo-randomized time-interleaved sampling, one of the idle or ready-to-sample sub-ADCs (generally one or more other ADCs would be busy sampling and/or performing a conversion of the analog input) can be randomly selected by the clocking block 102 as the ADC being used for sampling the analog input signal for a given cycle and converting the analog input signal to a digital output signal. Such selection implements pseudo-randomization. Randomized time-interleaved ADCs can have three or more ADCs (i.e., M is greater than or equal to three). Randomization necessitates an increase in the number of sub-ADCs (and additional digital logic to implement randomization) to achieve the same effective sampling rate of an ADC operating with a rotational sequence.

When randomization or the increase in the number of sub-ADCs is not practical, sub-ADCs sampling the analog input signal according to a rotational sequence would have spurs in the output spectrum. Calibration can be used to extract the interleaving errors that cause these spurs, and correct for the interleaving errors to reduce the spurs. Some calibration schemes operate in the background where the interleaving errors are extracted while the ADC is in normal operation (and does not have to be taken offline). Some calibrations operate blindly without information about the input signal. Specifically, these calibration schemes can observe the digital output signals, $D_{out0}, D_{out1}, \ldots D_{outM-1}$, in the background, and extract interleaving errors from the digital output signals. Since no fixed test signal is being injected, or the input signal is unknown, the background calibration schemes can only observe the digital output signals from the sub-ADCs to extract the interleaving errors. For instance, the background calibration schemes can compare the digital output signals to derive the interleaving errors of the sub-ADCs. Based on the derived interleaving errors, the background calibration scheme can drive the interleaving errors smaller as the scheme converges to an optimal interleaving error correction coefficient. Unfortunately, these kinds of background calibration schemes or blind calibration schemes are susceptible to certain undesirable input frequencies causing the background calibration to fail or diverge.

Problematic Input Conditions Such as Coherent Input Frequencies

Specifically, calibrations for interleaving errors caused by offset mismatches, gain mismatches, and timing skew are particularly susceptible to diverge under certain coherent input frequencies (or more broadly, certain input conditions). Certain coherent input frequencies can cause background or blind interleaving error calibrations to diverge, because respective digital output signals from the sub-ADCs would cause the calibrations to see an interleaving error that does not actually exist. For instance, the calibrations can see an interleaving error is much greater than the actual interleaving error.

In one example, in an ADC with M=2 sub-ADCs, e.g., subADC[0], and subADC[1], interleaving offset mismatch error calibration drives an average output of each sub-ADC to zero (i.e., DC to zero). When operating according to a rotational sequence, each sub-ADC samples every other sample. This means that the digital output signal $y_m[n]$ for a given sub-ADC[m] can be represented as follows:

$$y_m[n]=x[Mn+m] \qquad \text{(Equation 1)}$$

x[n] represents a sampled version of the analog input signal $v_{in}$. The data from subADC[0] for the interleaving offset mismatch error calibration in the example is thus $y_0[n]=x[2n]$, and the data from subADC[1] for the interleaving offset mismatch error calibration is thus $y_1[n]=x[2n+1]$.

A perfectly coherent signal such as $$\frac{F_S}{K}$$

has only K discrete data points after sampling. These data points do not change over time, and repeatedly sampling these discrete data points and building error estimates using them can cause background/blind calibrations to degrade or even diverge. For example, when K=M, i.e., $$\frac{F_S}{M},$$

then the sampled input signal has only M discrete data points. In an ADC with M sub-ADCs, each sub-ADC will repeatedly sample only a single data value from the "grid" of x[n]. Even if no actual offset mismatch between sub-ADCs is present, this will cause the background/blind calibration to interpret a large offset mismatch between sub-ADCs. From a different perspective, the input signal having frequency $$\frac{F_S}{M}$$

aliases to DC for each of the M sub-ADCs, causing an apparent mismatch to the background/blind calibration.

In one example, in an ADC with M=2 sub-ADCs, e.g., subADC[0], and subADC[1], a background/blind interleaving gain mismatch error calibration can drive the average power of the second sub-ADC (subADC[1]) to be equal to or to match the average power of the first sub-ADC (sub-ADC[0]) by scaling the amplitude of the second sub-ADC. Phrased differently, the background/blind interleaving gain mismatch error calibration drives the average absolute output (or power) of each sub-ADC to match a reference sub-ADC to normalize the average power of each sub-ADC. An analog input signal being a sinusoid having an input frequency of $F_S/4$ can produce a pattern of values: A, B, −A, −B, A, B . . . , etc. (where A and B are amplitudes depending on phase). Viewed differently, an input signal having frequency of $F_S/4$ has 4 discrete data points after sampling (e.g., A, B, −A, −B). If the calibration is only looking at amplitude (i.e., absolute value of the data points), then the input signal has just two discrete amplitudes points (e.g., A, and B). Each sub-ADC samples every other sample. Accordingly, a first sub-ADC, subADC[0], can sample: A, −A, A, −A . . . , while the second sub-ADC, subADC[1] can sample: B, −B, B, −B . . . . After applying the "power" measurement (e.g., absolute value), the data being used for calibration from subADC[0] is: A, A, A, A . . . , and the data being used for calibration from subADC[1] is: B, B, B, B . . . . In an extreme case, depending on the phase of the input signal A could be large and B could be close to zero. When the interleaving gain mismatch error calibration see the data from subADC[0] and subADC[1], the calibration would interpret that, the "power" of subADC[1] is much less than the "power" of subADC[0], and drive the subADC[1] strongly to correct/equalize the difference. In reality, the "powers" of subADC[0] and subADC[1] may be completely equal. So, the correction is not warranted and can cause an unintended interleaving gain mismatch error when a different analog input signal is provided to the ADC. This same phenomenon can occur with other coherent input frequencies, such as $F_S/4$ and $F_S/8$ where the number of discrete data points in the signal after sampling is small, and the difference in value or magnitude of these discrete data points (or value of the discrete amplitude points) between the sub-ADCs can cause an appearance of gain mismatch (or other mismatches) when none really exist. In the presence of coherent input frequencies, the calibrations may erroneously extract an interleaving gain mismatch error that is much larger than the actual interleaving gain mismatch error.

Broadly speaking, input signals with coherent input frequency at $$\frac{F_S}{K},$$

where K is an integer (e.g., where K is less than or equal to 32), or input signals with a coherent input frequency at some integer multiple of $$\frac{F_S}{K},$$

such as $$L * \frac{F_s}{K},$$

where L is an integer, may pose problems for background/blind calibrations for interleaving errors caused by, e.g., offset mismatch, gain mismatch, and timing skew. Some coherent input frequencies having the above relationship with the overall sampling rate of the ADC, i.e., $F_S$, can cause the background/blind calibrations to fail.

For M sub-ADCs, signals at the following coherent input frequencies can cause interleaving error calibrations to diverge or fail:

$$\Omega = L * \frac{F_s}{K} \qquad \text{(Equation 2)}$$

L and K are integers. In general, K is a small integer, preferably less than or equal to 32.

FIGS. 2-6 illustrates two sub-ADCs, subADC[0] and subADC[1], sampling input signals having certain coherent input frequencies, according to some embodiments of the disclosure. "dout" represents sampled version of the analog input signal $v_{in}$. "abs(dout)" represents absolute values of "dout" (or magnitude of "dout"). The data from subADC[0] being used for calibration is marked with an "x", and data from subADC[1] being used for calibration is marked with a "*".

Figure 2:
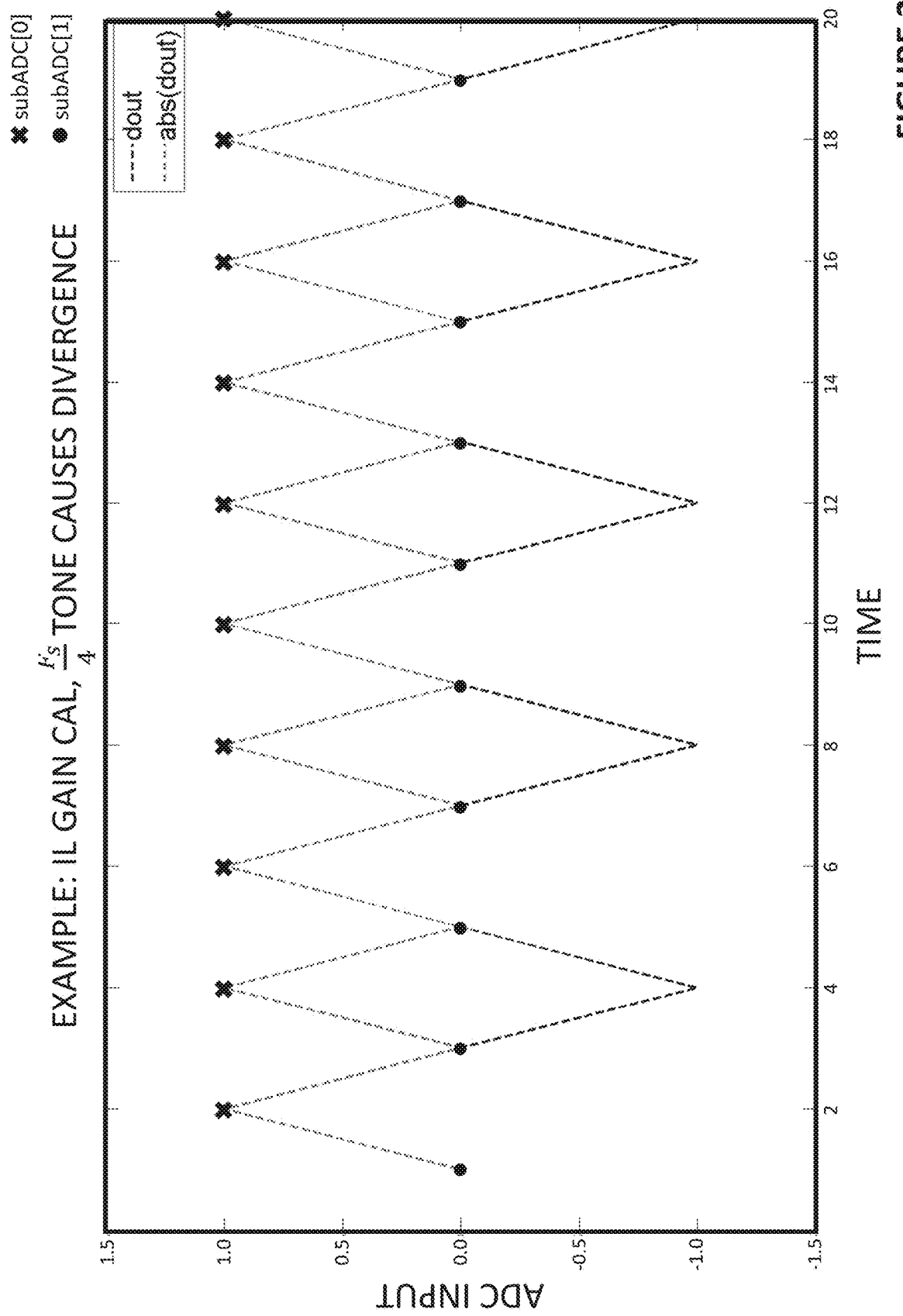
FIGS. 2-6 illustrates two time-interleaved ADCs sampling input signals having certain coherent input frequencies, according to some embodiments of the disclosure.

In FIG. 2, the input frequency is at $$\frac{F_s}{4}.$$

It can be seen that "abs(dout)" generates has four discrete data points, and thus two amplitude points (e.g. 1.0 and 0.0). The data from subADC[0] have only values of one of the two amplitude points (1.0), and data from subADC[0] have only values of the other of the two amplitude points (0.0). The interleaving gain mismatch calibration would diverge.

Figure 3:
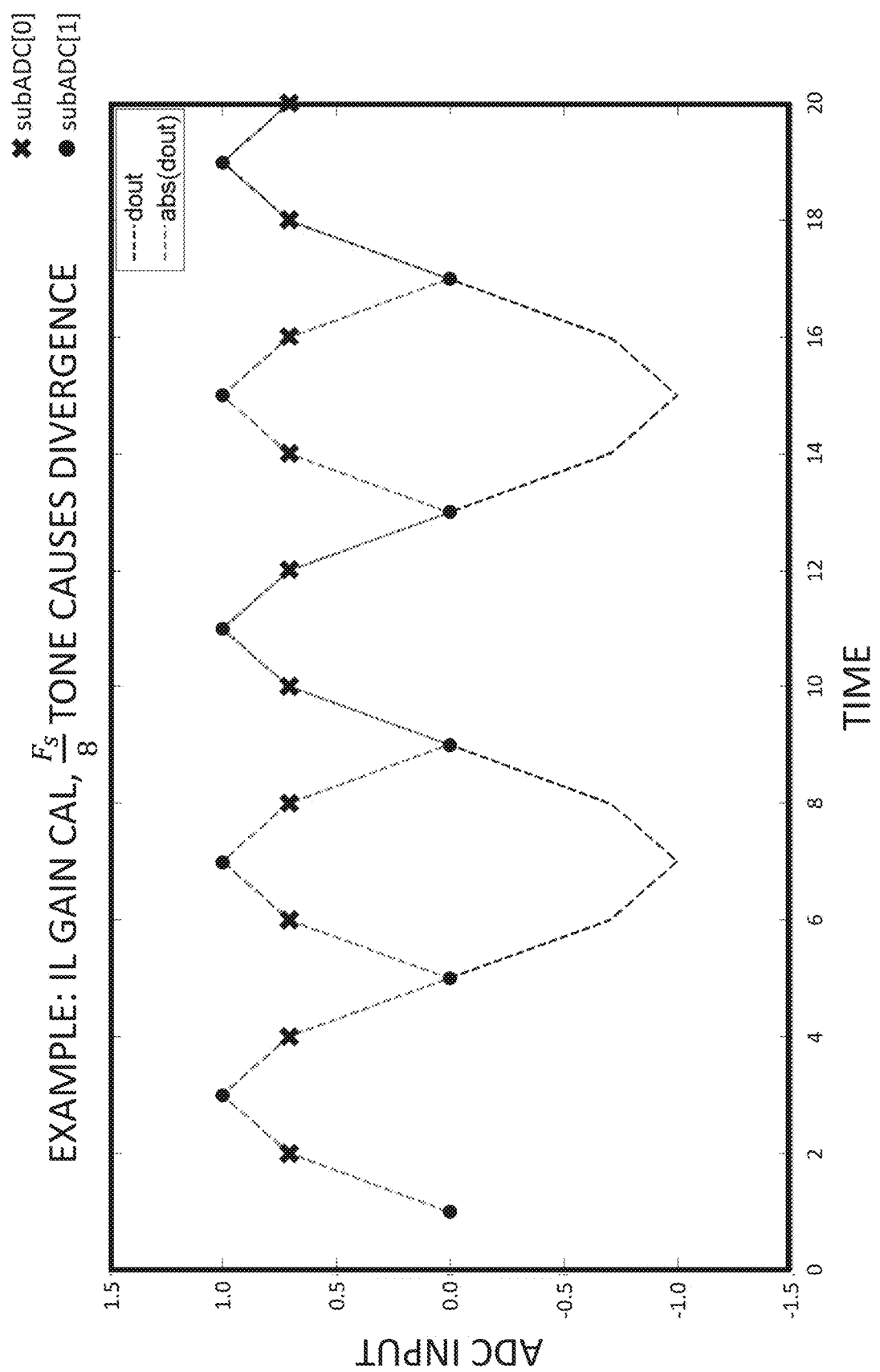

In FIG. 3, the input frequency is at $$\frac{F_s}{8}.$$

It can be seen that "abs(dout)" generates eight discrete data points and four amplitude points (e.g., providing three unique amplitude points because two amplitude points are zero, i.e., 1.0, 0.7, and 0.0). The data from subADC[0] have only values of one of the three amplitude points (0.7), and data from subADC[0] have only values of the other two of the three amplitude points (1.0, 0.0). The interleaving gain mismatch calibration would diverge.

Figure 4:
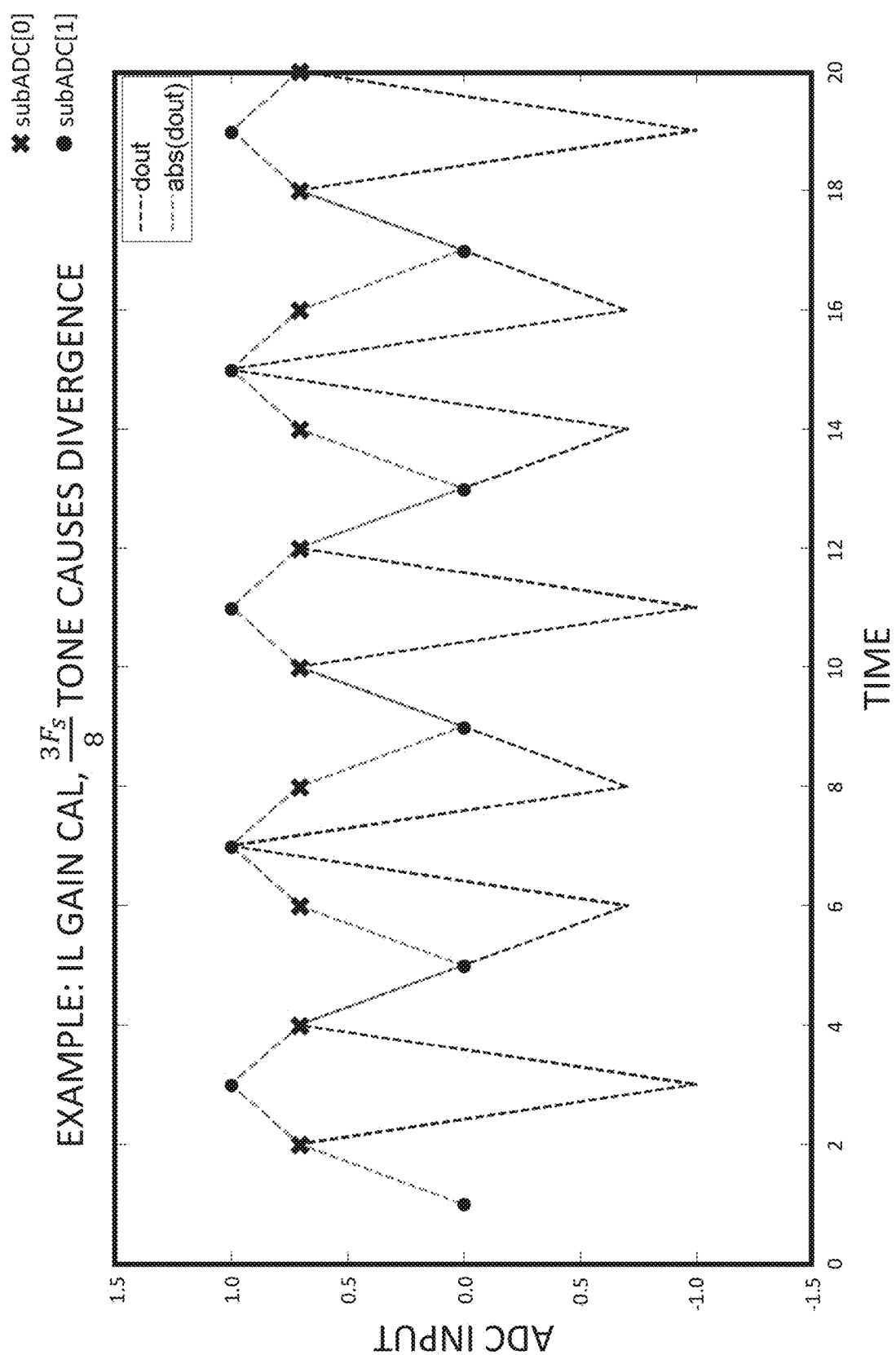
Figure 5:
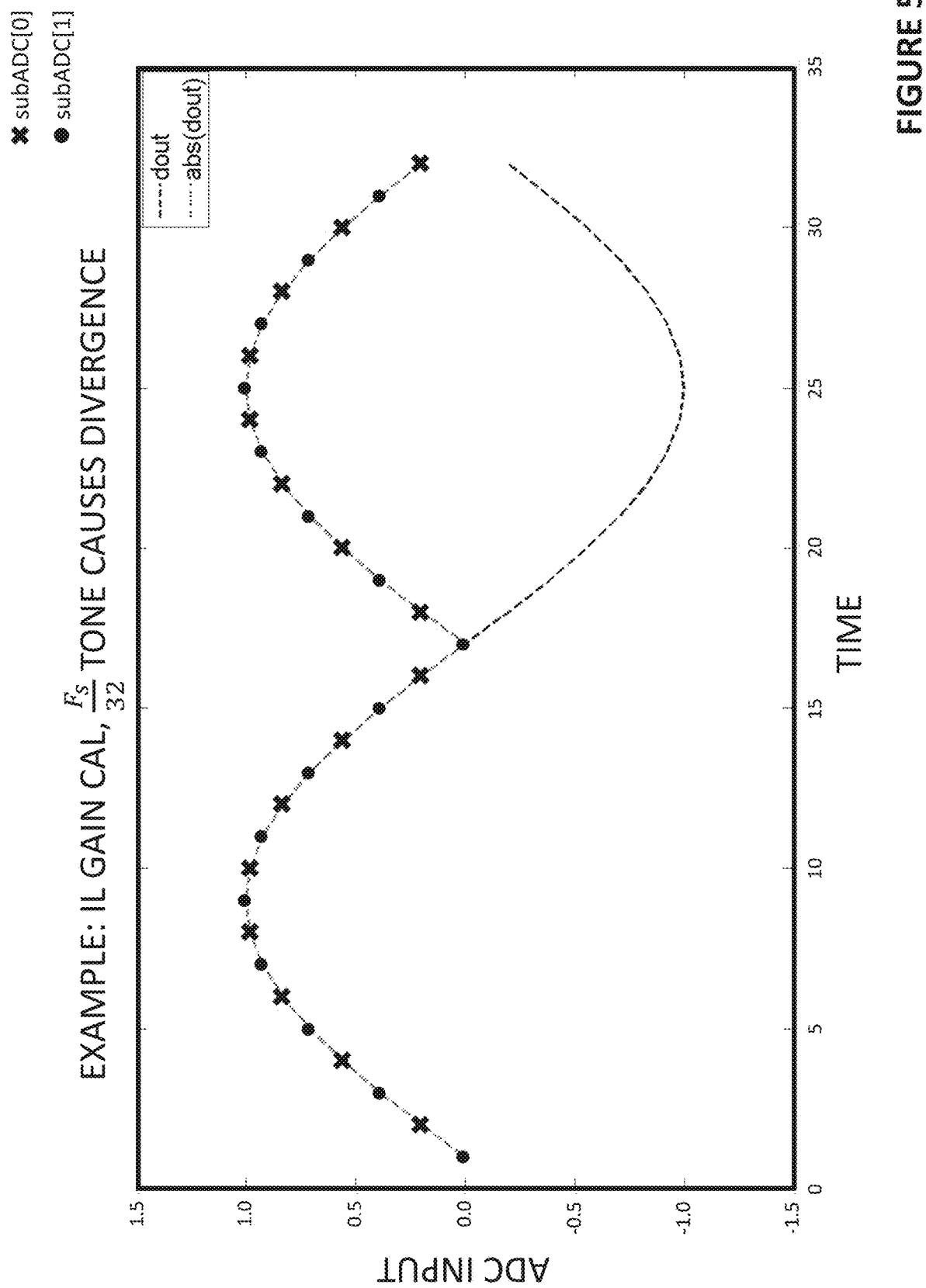
Figure 6:
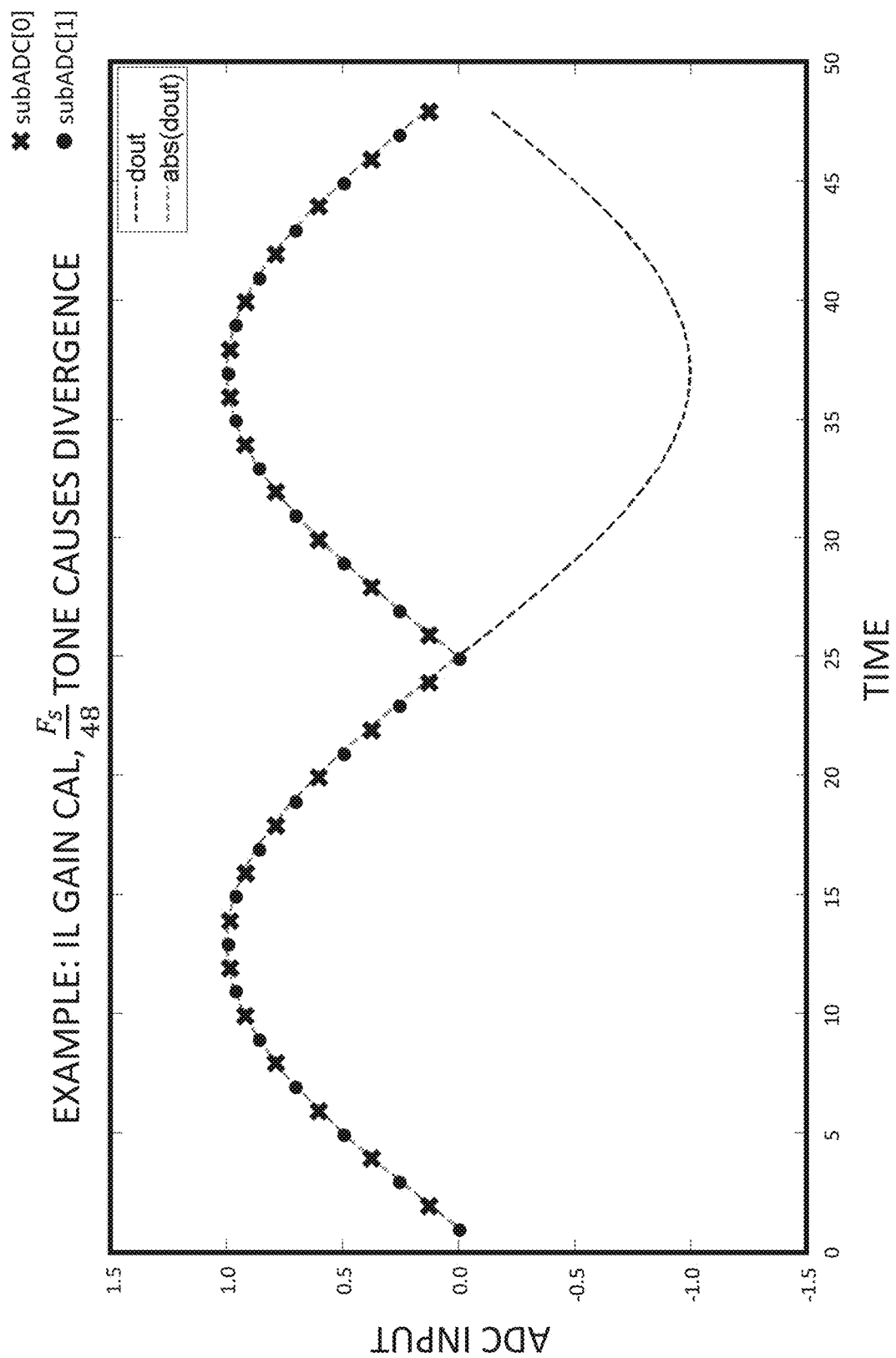

In FIG. 4, the input frequency is at $$\frac{3F_s}{8}.$$

It can be seen that "abs(dout)" generates eight discrete data points and four amplitude points (e.g., providing three unique amplitude points because two amplitude points are zero, i.e., 1.0, 0.7, and 0.0). The data from subADC[0] have only values of one of the three amplitude points (0.7), and data from subADC[0] have only values of the other two of the three amplitude points (1.0, 0.0). The interleaving gain mismatch calibration would diverge.

For small K, such as $$\frac{F_s}{4}(K=4)$$

as seen in FIG. 2, the difference in amplitude points (i.e., the data) between sub-ADCs can be very large, causing the background/blind interleaving gain mismatch error calibration to diverge significantly and rapidly. For larger K, such as $$\frac{F_s}{64}(K=64),$$

the difference in amplitude points (i.e., the data) between sub-ADCs is decreased due to an averaging effect, minimizing the interleaving gain mismatch calibration divergence. Moreover, the issue diminishes rapidly as n increases. Consider FIGS. 5 and 6, where the input frequency is at $$\frac{F_s}{32},$$

and $$\frac{F_s}{48}$$

respectively. The data from subADC[0] have a variety/diversity of amplitude points, and the data from subADC[1] also have a variety/diversity of amplitude points. The interleaving gain mismatch error calibration can still diverge in the examples seen in FIGS. 5 and 6, but would diverge far less so than the examples seen in FIGS. 2-4. Broadly speaking, the smaller number of unique amplitude points available, the more likely and rapidly the calibrations would diverge.

Generally speaking, the same coherent input conditions that can cause background/blind interleaving offset mismatch error calibration or interleaving gain mismatch error calibration to diverge can also cause other background/blind calibrations, e.g., interleaving timing skew calibration, to diverge as well.

While these passages describe coherent input frequencies (e.g., as illustrated by Equation 2) as being one of the problematic input conditions for why the background/blind calibrations would diverge or fail, it is noted that there are other problematic input conditions which can also cause the calibrations to diverge or fail. For instance, an input signal being a coherent square wave or other collections of coherent tones) can also be problematic and cause the calibrations to diverge or fail. Such an input signal can cause the data points (or amplitude points) to cluster on just a few points repeated over time.

Designing a Qualifier to Detect the Problematic Input Conditions Based on Histograms To address this issue, it is possible to implement a qualifier which can detect the problematic input conditions, such as coherent input frequencies. The qualifier can prevent calibration updates when valid signal conditions are not met, such as the presence of a coherent input frequency or the input signal has coherent signal energy at $$L*\frac{F_s}{K}.$$

As a result, the background/blind calibration scheme is more robust and users of the ADC can avoid frequency planning. The qualifier is preferably low-cost in terms of hardware, simple, and effective at detecting a coherent input frequency. It is not practical to extract the input frequency directly. It is more practical to implement a qualifier which can detect the problematic input conditions which is likely to cause the interleaving error calibrations to fail or diverge. The qualifier can produce a qualification result to pause or freeze the interleaving error calibrations to prevent the calibrations from diverging.

Background/blind calibrations for interleaving errors can implement "block processing" where a data block of N data points (N can be 4,000 to 64,000, or any suitable number of data points) is used to estimate an (averaged) error, an update to the interleaving error correction coefficient is computed and applied, and the process repeats. One technical task for the qualifier is to: for each data block, qualify calibration data block with a pass/fail as the qualification result. When the data block fails qualification, the update is not computed nor applied. This means the interleaving error correction coefficient holds the previous value. When the data block qualifies, the update is computed and applied. Holding the previous value for the interleaving error correction is not ideal, but it is much more benign than performing a "bad" update that would cause the calibration to diverge. Block processing can occur in real time, or can be done on a data block stored in a buffer.

As illustrated by FIGS. 2-6 and the accompanying description, each sub-ADC samples a repeating "grid" of discrete data points when a coherent input frequency is present. When the input does not have a coherent input frequency, each sub-ADC will (over time) sample a diverse or wide range of data points on input signal or the input sinusoid. One possible way to effectively and efficiently differentiate coherent input frequencies and non-coherent input frequencies is to use histograms.

In some embodiments, the qualifier uses a coarse histogram generated from a data block comprising output values, e.g., output data points, output values, or amplitude points, of one of the plurality of time-interleaved ADCs (one of the M sub-ADCs, such as the sub-ADC that is used as the reference sub-ADC for the background/blind calibration).

Note that the qualifier can output a qualification result based on the output values of any one of the M sub-ADCs. The qualifier can output a qualification result based on output values of a sub-ADC being used as the reference sub-ADC in the blind calibrations. The sub-ADC whose output values are being used in the qualification process can be selected at random. The qualifier can apply the qualification process for more than one of the sub-ADCs as well, if desired. The qualifier can generate multiple qualification results based on separate histograms generated from the sub-ADCs and logically combine the multiple qualification results to generate a final qualification result.

In some cases, in a 12-bit ADC, the output data points can have 12 bits data values, and the amplitude points can have 11 bits data values). The coarse histogram can operate on a subset of these bits. In one example, the coarse histogram is be a 5-bit histogram (i.e., a histogram having 32 bins).

For non-coherent input frequencies, i.e., analog input signals being non-"bad" sinusoidal inputs (i.e., K in Equation 2 is a non-integer, such as 3.978), the histogram of the amplitude points would appear relatively "smooth", with adjacent bins having similar count values. In contrast, the histogram resulting from an analog input signal having a coherent input frequency (e.g., "bad" inputs such as K=4 or K=8 in Equation 2) is likely to have many empty histogram bins, and a few bins with a large number of count values. This histogram is a result of a sub-ADC sampling a repeating "grid" of amplitude points.

Figure 7A:
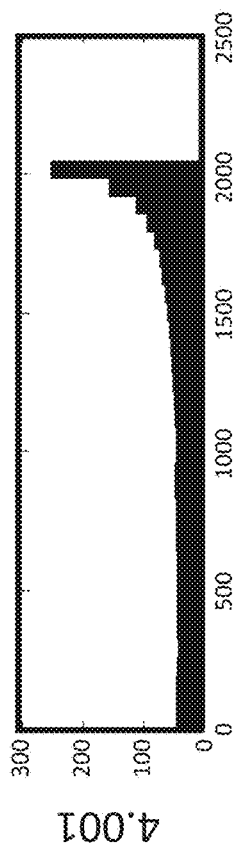
Figure 7B:
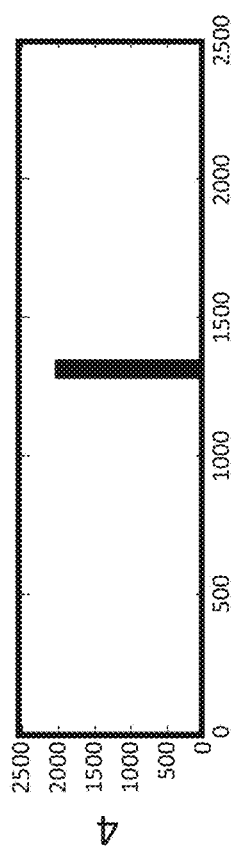
Figure 8A:
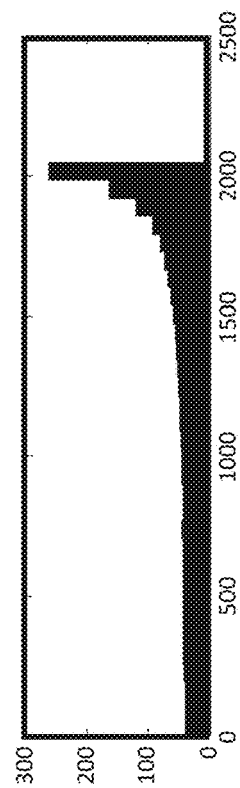
Figure 8B:
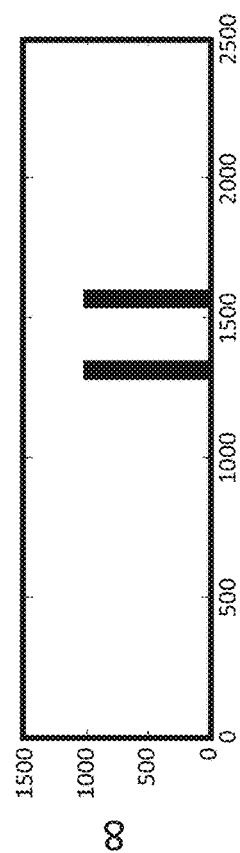
Figure 9A:
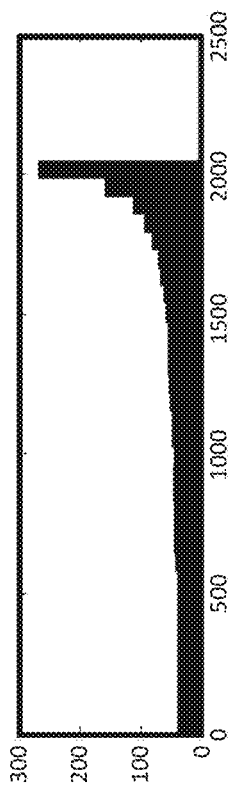
Figure 9B:
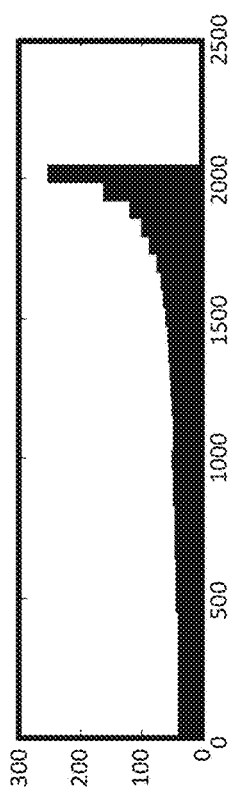
Figure 10A:
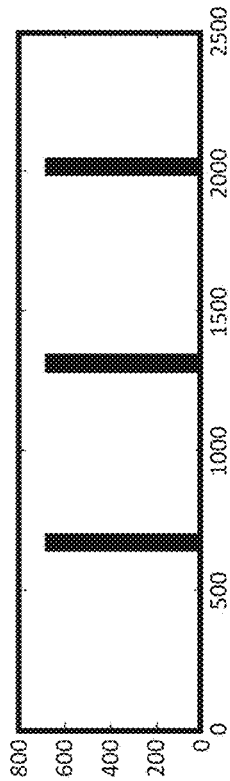
Figure 10B:
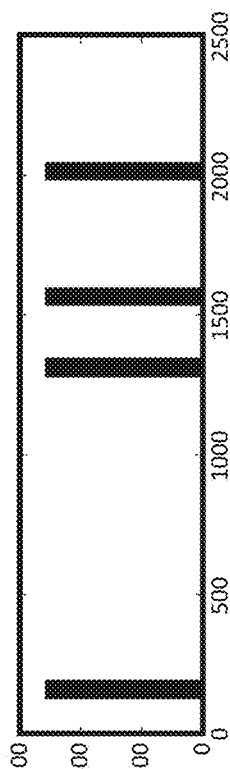

FIGS. 7A-B, 8A-B, 9A-B, 10A-B, and 11A-G are histograms of digital output signals generated from input signals having various frequencies, according to some embodiments of the disclosure. In FIG. 7A, K=4 (where the analog input signal has a coherent input frequency), one bin of the histogram has a large count value, and the rest of the bins have a count value of zero (empty). In FIG. 7B, K=4.001 (where the analog input signal has a non-coherent input frequency), the histogram is "smooth" where many adjacent bins share similar bin count values. In FIG. 8A, K=8 (where the analog input signal has a coherent input frequency), two bins have large count values, and the rest of the bins have a count value of zero (empty). In FIG. 8B, K=8.001 (where the analog input signal has a non-coherent input frequency), the histogram is "smooth" where many adjacent bins share similar bin count values. In FIG. 9A, K=12 (where the analog input signal has a coherent input frequency), three bins have large count values, and the rest of the bins have a count value of zero (empty). In FIG. 9B, K=12.001 (where the analog input signal has a non-coherent input frequency), the histogram is "smooth" where many adjacent bins share similar bin count values. In FIG. 10A, K=16 (where the analog input signal has a coherent input frequency), four bins have large count values, and the rest of the bins have a count value of zero (empty). In FIG. 10B, K=16.001 (where the analog input signal has a non-coherent input frequency), the histogram is "smooth" where many adjacent bins share similar bin count values.

Figure 11D:
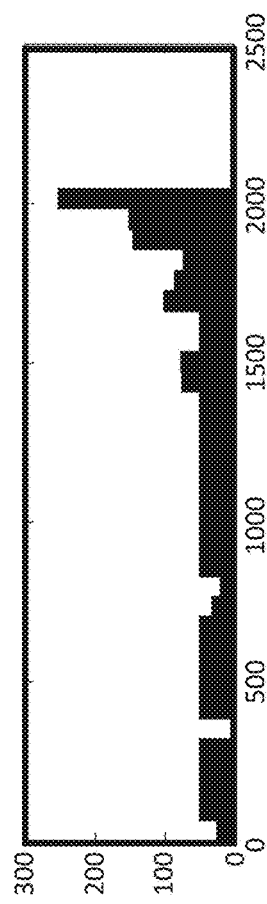
Figure 11E:
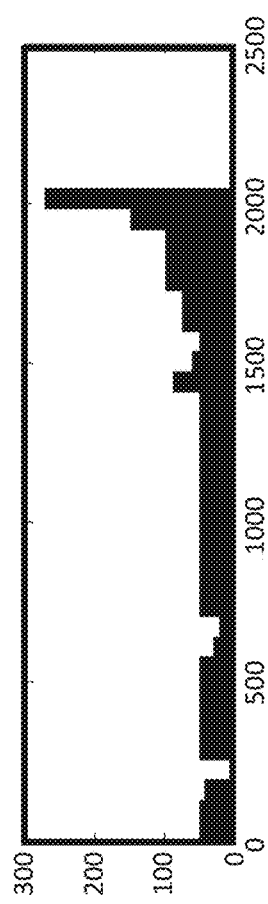
Figure 11F:
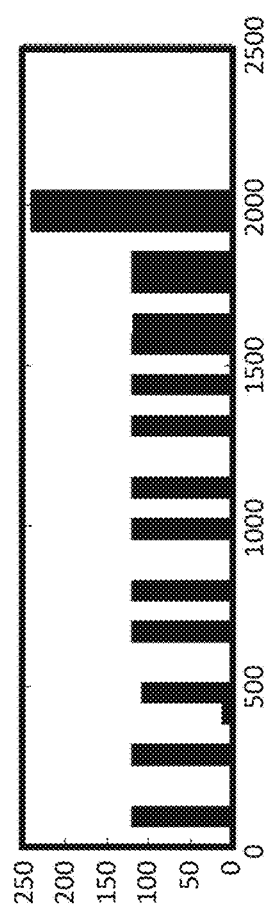
Figure 11G:
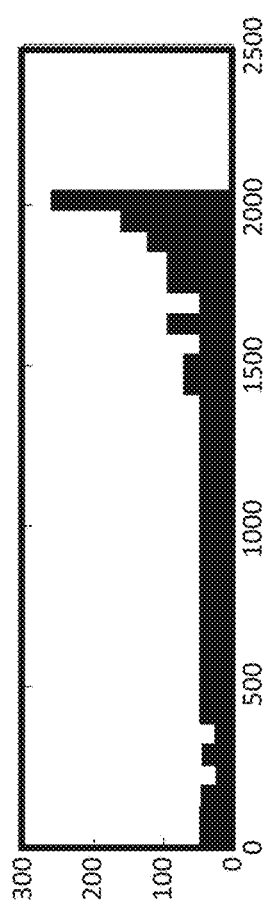

As illustrated by least FIGS. 7A, 8A, 9A, and 10A, histograms generated as a result of having an analog input signal with a coherent input frequency are "clustered" in one to a few bins due to each sub-ADC sampling the same amplitude points repeatedly on a fixed "grid". As illustrated by at least FIGS. 7B, 8B, 9B, and 10B, histograms generated as a result of having an analog input signal with a non-coherent, or "near coherent" frequency has a relatively smooth histogram. In some cases, analog input signals having non-coherent inputs may not necessarily generate a smooth histogram. Referring back to FIG. 10A, K=16 (where the analog input signal has a coherent input frequency), four bins have large count values, and the rest of the bins have a count value of zero (empty). FIGS. 11A-G shows histograms generated from output values of a sub-ADC, where the analog input signal has a non-coherent input frequency. In FIG. 11A, K=16.2. In FIG. 11B, K=16.4. In FIG. 11C, K=16.6. In FIG. 11D, K=16.8. In FIG. 11E, K=17.0. In FIG. 11F, K=17.2. In FIG. 11G, K=17.4. The histograms are only somewhat smooth (when compared to FIGS. 7B, 8B, 9B, and 10B), and some histograms may have several empty bins.

A technical task of the qualifier is to distinguish histograms having one or more clusters, and histograms which are smooth or somewhat smooth. Implementing such a qualifier is not trivial. Some non-coherent input frequencies such as K=17.2 seen in FIG. 11F can have a number of empty bins. Instead of purely judging the histogram based on the number of empty bins, the qualifier can detect whether the analog input signal has a coherent input frequency by evaluating a statistic of the histogram. Specifically, the qualifier can evaluate a variability measurement which can reflect the amount of clustering in the histogram. The present disclosure describes a variability measurement which can be used to evaluate an average deviation from the mean as a measure of smoothness. The absolute value of the deviation/difference from the mean can be used instead of squaring (usually found in a typical variance calculation) for low-cost implementation. The variability measurement can be compared to a programmable threshold, and the comparison can be used in deciding whether to update calibration or not. A histogram can be viewed as a tool for coarsely estimating the probability distribution function or the probability mass function of the input signal.

The variability measurement V representing an amount of clustering can be formulated as follows:

$$V = \sum_{k=0}^{B-1} |bin[k] - \mu| \qquad \text{(Equation 3)}$$

B is the number of bins in the histogram. u is the expected value for count values of the histogram. The variability measurement V can be a useful statistic to evaluate, e.g., against a programmable threshold, in order to detect whether the analog input signal has a coherent input frequency. If the variability measurement V is above the programmable threshold, then the qualifier can determine that the data block fails qualification. If the variability measurement V is below the programmable threshold, then the qualifier can determine that the data block qualifies.

In words, the variability measurement V is a sum of distances of count values bin[k] in the bins of the qualifying histogram from a mean count value p of the qualifying histogram (e.g., |bin[k]–μ|). An absolute value of the difference of count value to the mean count value, bin[k]–μ, is used as the distance/deviation for lower cost implementation. Alternatively, the difference of count value to the mean count value, bin[k]–μ, can be squared, i.e., (bin[k]–μ)².

The mean count value p of the qualifying histogram can be an expected value for count values of the qualifying histogram. In other words, the qualifier determines the amount of clustering by adding differences in count values between the qualifying histogram and a uniform histogram. A uniform histogram is a flat histogram where each bin has a same count value, i.e., the expected value for count values of the qualifying histogram. The expected value for count values can be a total count value of a histogram divided by a number of bins. For instance, if a total count value is 2048, and the histogram has 32 bins, then µ=64.

The intuition behind the variability measurement V is that the calculation would measure how far off the qualifying histogram is from a perfectly smooth and flat histogram (i.e., a uniform histogram). In other words, the calculation can measure the amount of smoothness. When the analog input signal has a coherent input frequency, a sub-ADC would sample a same set of amplitude point(s) repeatedly, leading to a histogram with one or more clusters. As a result, the histogram would yield a high variability measurement V. When the analog input signal has a non-coherent input frequency, a sub-ADC would sample a wide range of amplitude point(s) over time, leading to a smooth or somewhat smooth histogram. As a result, the histogram would yield a low variability measurement V.

The variability measurement V could be modified in a number of ways to achieve the same goal. Once a coarse histogram is created to estimate the probability distribution function or probability mass function of the unknown input signal, the qualifier can evaluate evaluating a statistic of the histogram to get a qualification result (e.g., pass or fail). For example, instead of comparing the histogram to a uniform histogram, the qualifier can compare the histogram to some other expected histogram having a different and possibly more realistic or expected shape, such as a Gaussian shaped histogram, or exponential histogram, etc. The shape of the histogram can be selected to optimize the accuracy of the qualifier. The uniform histogram comparison is one example histogram that can be used for computing the variability measurement V. The uniform histogram comparison can be beneficial since it is easy and inexpensive to implement in hardware.

The qualifier does not have to specifically determine or identify that an input signal has a coherent input frequency, or other root causes of calibration divergence issues. However, the qualifier is implemented to determine whether the output values of a sub-ADC meets one or more qualifying conditions. If the qualifier determines that one or more qualifying conditions are met, the qualifier can infer that the problematic input conditions exist, and pause the calibrations. For instance, the qualifier can assess the level of diversity, variability, or "richness" in the output values of a sub-ADC, and use that level to dictate whether to pause the calibrations. The qualifier can compare the qualification histogram against an expected histogram. The qualifier can compare the variability measurement against a threshold. Such assessments detects whether the qualification histogram meets one or more qualifying conditions, but do not specifically determines the input frequency.

Details of the qualifier architecture and processes are described in the following passages.

Figure 12:
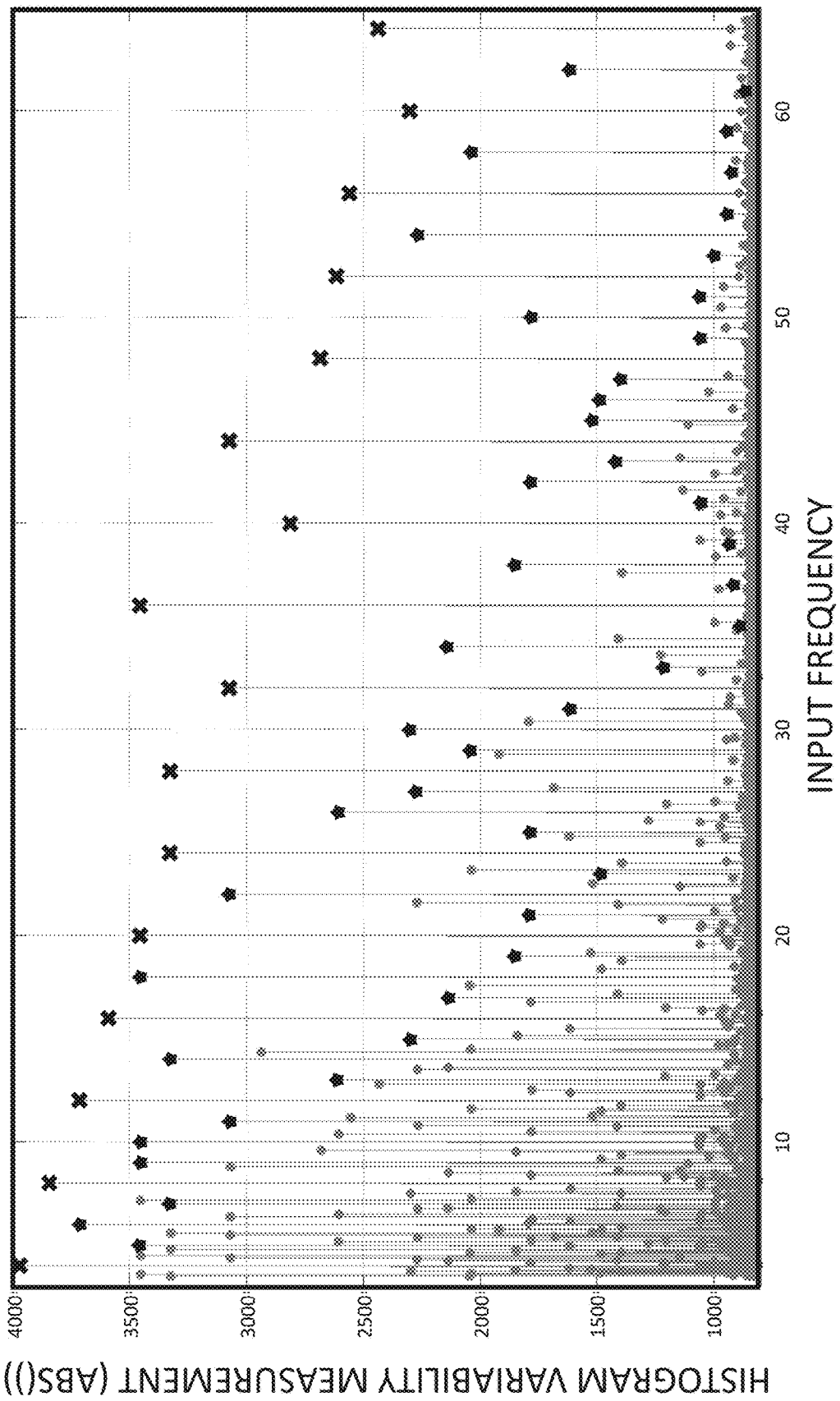
FIGS. 12 and 13 show plots of input frequency versus histogram variance for two input signals having different signal ranges, according to some embodiments of the disclosure.
Figure 13:
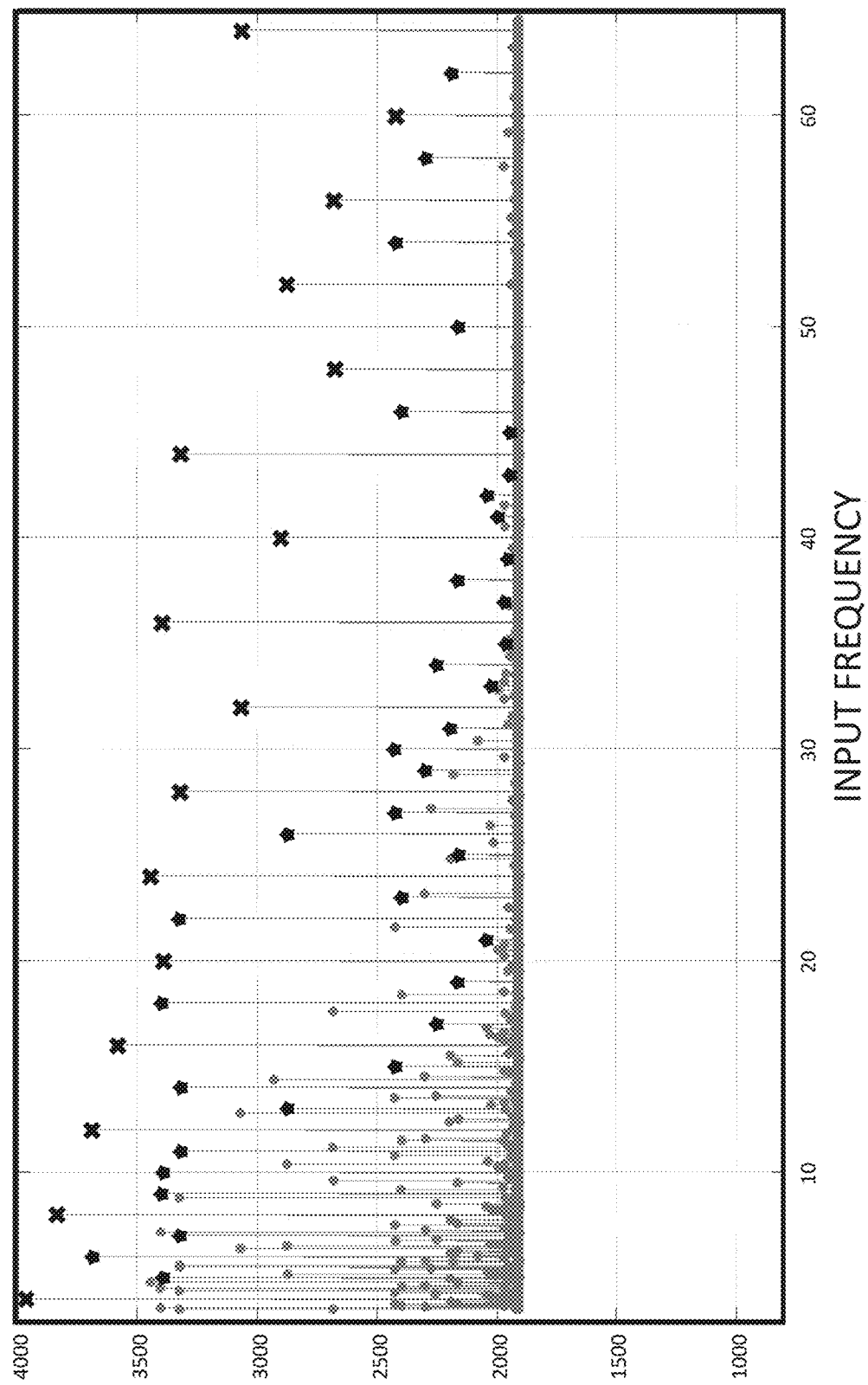

Considerations for the Qualifier: Different Signal Ranges and Sensitivity of Threshold One consideration to take into account when using a histogram is that the signal range or amplitude of the analog input signal can vary significantly. Ideally, the qualifier and any interleaving error calibration would continue to operate properly for relatively small input signals (e.g., down to at least −30 dB or so) and relative large signals. FIGS. 12 and 13 show plots of input frequency versus histogram variability measurement for two input signals having different signal ranges, according to some embodiments of the disclosure. In FIG. 12, the signal is at −0.1 dB, and the full range of histogram is expected to be exercised. In FIG. 13, the signal is at −5.9 dB, which would only occupy half the range of the histogram. Note that the variability measurement changes depending on the signal range of the analog input signal. For instance, the "floor" of the variability measurement increases from ~700 to ~1900 from FIG. 12 to FIG. 13.

Another consideration to take into account is the sensitivity of the threshold. A suitable threshold preferably allows false-positives, while aggressively ensures there are no or very little false-negatives. Allowing false-positives means that qualification would fail, i.e., not pass the threshold check for some histograms, even when the data block is not a result of an analog input signal having a coherent input frequency. This errs on the side of caution, and pauses the calibration update even when it's not needed. Aggressively disallowing false-negatives prevents the calibration from updating when it should not update due to the coherent input frequency. From these plots seen in FIGS. 12-13, a suitable threshold could be set ~2300 for evaluating the variability measurement.

Yet another consideration to take into account is complexity. The histograms mentioned herein can operate solely on the most significant bits (e.g., a small number of most significant bits) of the output values of a sub-ADC. The histogram does not require all bits of the output values to be used (the least significant bits are not needed for the qualifier). Using only the most significant bits for building the histogram can significantly reduce complexity and make the qualifier more efficient. Moreover, the bin count values can be truncated to a certain number of bits as well for additional complexity reduction. The number of bins in a histogram can also add complexity if too many bins are used. Also, too many bins or too little bins may yield a bad histogram which is not informative or useful for the qualifier. A 5-bit histogram having 32 bins can be adequate for some applications. Preferably, a coarse histogram of the output values of the sub-ADC is used, and the qualifier is implemented in such a way to handle a coarse histogram and still achieve the sensitivity and performance desired for the target application.

Data Block Processing and Qualification

Figure 14:
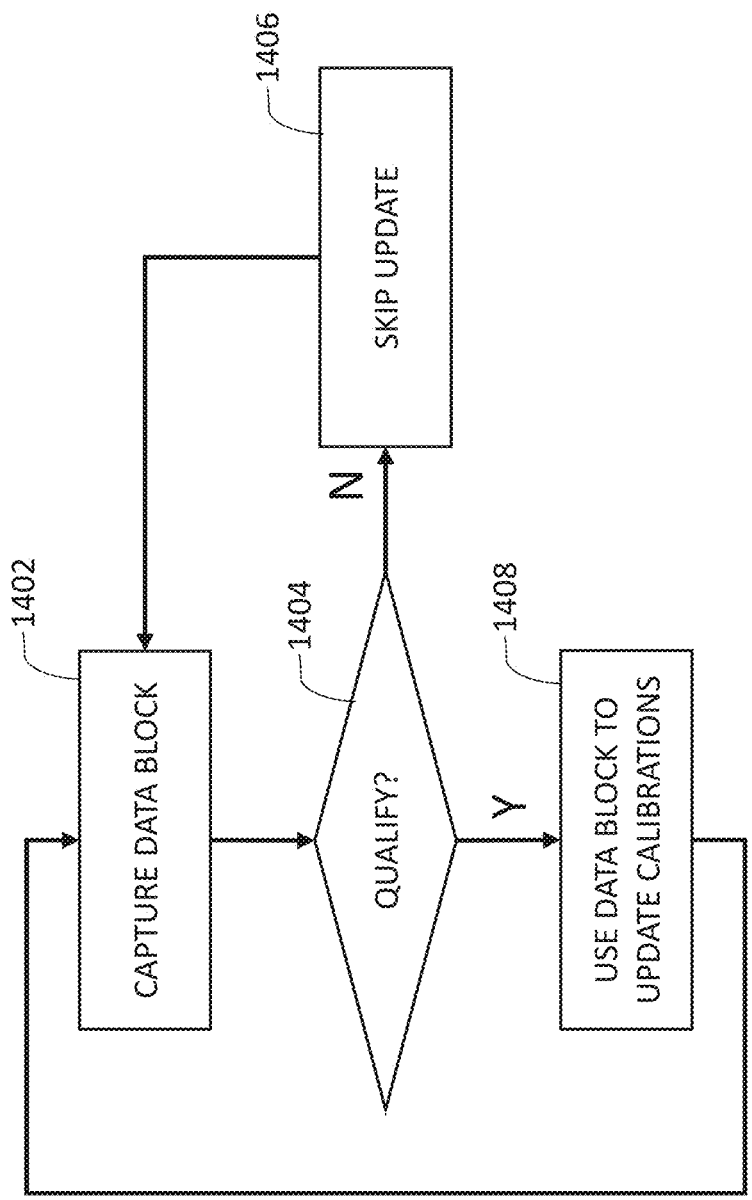
FIG. 14 is a flow diagram illustrating an exemplary method for qualifying data used for background/blind calibration of interleaving errors, according to some embodiments of the disclosure.

FIG. 14 is a flow diagram illustrating an exemplary method for qualifying data used for background/blind calibration of interleaving errors, according to some embodiments of the disclosure. In 1402, a data block is captured. The data block comprises (digital) output values generated by one of the plurality of time-interleaved analog-to-digital converters (one of the sub-ADCs). An optional buffer, e.g., buffer 120 of FIG. 1, can be included store a data block comprising values generated by one of the plurality of time-interleaved analog-to-digital converters. In some embodiments, a qualification histogram can be generated by a histogram function, e.g., 170 of FIG. 1 in qualifier 122 based on the values generated by one of the plurality of time-interleaved analog-to-digital converters. Depending on the implementation, the histogram function can run in real time (obviating the need to store the values in a buffer). In 1404, the data block is qualified by evaluating a variability measurement of a qualification histogram generated from the data block. A qualifier, e.g., qualifier 122 of FIG. 1, can measure an amount of clustering in a qualification histogram generated from the data block and output a qualification result based on the amount of clustering. In response to determining that the data block fails qualification ("N" path from 1404), an update of the background/blind calibration of the interleaving error is skipped (1406). In response to determining that the data block qualifies ("Y" path from 1404), the data block is used to update the background/blind calibration of the interleaving error (1408). An interleaving error calibration engine, e.g., interleaving error calibration engine 150 of FIG. 1, can be controllable by a qualification result from the qualifier. The qualification result dictates whether the interleaving error calibration engine is to hold a previous value of an interleaving error correction coefficient or to update an interleaving error correction coefficient.

In some embodiments, the data block comprises uncorrected (digital) output values (e.g., $D_{out0}, D_{out1}, \ldots D_{outM-1}$) generated by one of the plurality of time-interleaved analog-to-digital converters (one of the sub-ADCs). In some embodiments, the data block has corrected (digital) output values (e.g., $D_{out0\_cal}, D_{out1\_cal}, \ldots D_{outM-1\_cal}$) generated by one of the plurality of time-interleaved analog-to-digital converters (one of the sub-ADCs).

Referring back to FIG. 11, the interleaving error calibration engine 150 of FIG. 1 can include an interleaving error extractor 124 to derive the interleaving error and update an interleaving error correction coefficient (e.g., $e_0, e_1, \ldots e_M$) based on the interleaving error. For instance, the interleaving error extractor 124 can derive the interleaving error from corrected output values (e.g., $D_{out0\_cal}, D_{out1\_cal}, \ldots D_{outM-1\_cal}$). The interleaving calibration error engine 150 of FIG. 1 can further include an interleaving error correction block 126 to apply interleaving error correction coefficient (e.g., $e_0, e_1, \ldots e_{M-1}$) to reduce the interleaving error. The interleaving error correction coefficient can be applied digitally to the uncorrected output values (e.g., $D_{out0}, D_{out1}, \ldots D_{outM-1}$) generated by the plurality of time-interleaved analog-to-digital converters to generate corrected output values (e.g., $D_{out0\_cal}, D_{out1\_cal}, \ldots D_{outM-1\_cal}$). A data combiner 130 can combine the corrected output values (e.g., $D_{out0\_cal}, D_{out1\_cal}, \ldots D_{outM-1\_cal}$) to generate a final output $D_{out}$.

Adapting to Signal Range

As discussed previously, the signal range can dramatically change the variability measurement. A small signal can appear clustered in a few bins of the histogram since the full range of the histogram is not being exercised, which could lead the data block to fail qualification unnecessarily. To address this issue, the qualifier can perform a signal range check or perform a signal range estimate, and adjust the qualifier according to the signal range. In some cases, a qualifier can use a subset of the output values from a sub-ADC for this purpose (e.g., during a first half of a calibration cycle), and use the rest of the output values (or all of the output values) to build a qualification histogram (e.g., during a second half of a calibration cycle). In some embodiments, a range histogram can be generated based on a first part of the data block (e.g., the subset of output values). A signal range can be estimated based on the range histogram. A qualifying histogram can be generated according to the signal range, based on the second part of the data block (e.g., the rest of the output values). If the signal is not changing frequently, the signal range estimate can be skipped in some cycles.

FIG. 15 is a flow diagram illustrating another exemplary method for qualifying data used for background/blind calibration of interleaving errors, according to some embodiments of the disclosure. In 1502, a signal range of the data block is determined. In some embodiments, the signal range can be determined from a range histogram generated from the subset of output values. One or more upper empty bins of the range histogram is an indicator of signal range. A smaller signal would leave upper bins empty since a small signal cannot exercise the full range of the range histogram.

In 1504, a range for the qualification histogram can be set based on the signal range. For instance, the upper limit of the range for the qualification histogram can be shifted to the point where the one or more upper empty bins begin.

In 1506, one or more programmable thresholds for evaluating the variability measurement of the qualification histogram can be set based on the signal range. This feature can allow the threshold to be adjustable for the signal range such than an optimum threshold with the appropriate sensitivity can be used for different signal ranges.

In 1508, a qualification histogram is generated, e.g., based on the range set in 1504 using the rest of the output values. The qualification histogram can be generated using only the most significant bits (e.g., [MSB-1:MSB-5]) or some bits below the most significant bits (e.g., [MSB-3:MSB-8]). The latter works by binning any output value above the range in the top bin and binning any output value below the range in the bottom/zero bin. For a given range of the qualification histogram, values above the upper limit of the range are collected in the highest (or "top") histogram bin. Based on the qualification histogram, one or more checks can be performed in 1508 to generate the qualification result.

FIG. 16 is a flow diagram illustrating an exemplary method for qualifying a block of data, according to some embodiments of the disclosure. FIG. 17 illustrates exemplary components within a qualifier 122, which can be used to implement one or more parts of FIGS. 15 and 16, according to some embodiments of the disclosure.

The range estimator 1702 can determine a signal range estimate of the data block and configuring a range of the qualification histogram based on the signal range estimate (e.g., 1502 of FIG. 15). For example, if the signal spans +0 to +2047 codes, and a 5-bit histogram is used, then normally each histogram bin to is expected to span 2048/(25)=64 codes. So, bin 0 (the lowest) would be any codes from 0 to 63, bin 1 from 64 to 127, . . . and bin 31 (the highest) would be codes 2016 to 2047. These expectations assume a full-scale input signal. If the signal was −18 dB down, then only $\frac{1}{8}^{th}$ of the bins would ever be exercised. This would cause those 12% of bins to very large, and the other 88% of bins to be empty, likely causing a variability measurement check to fail. Hence, a signal range estimate is performed first using a range histogram, then a range of the qualification histogram is set to the maximum bin value of the range histogram that is non-zero. Digital hardware (e.g., histogram function 170 of FIG. 1) is already implemented to generate a qualification histogram, thus, the same hardware for generating the qualification histogram can be reused for generating the range histogram. In other words, the upper limit of the range of the qualification histogram slides/scale to match where the consecutive empty bins from the top of the range histogram stops. In this specific example, if the signal was −18 dB down, then the range histogram would show that the maximum bin value of the range histogram that was non-zero was bin 4. The upper limit of the qualification histogram can be adjusted that the max value is +256 (instead of +2048), and the bin width is now 256/32=8. Shifting the range of a histogram can adjust the range by powers of 2, e.g., to ½ full-scale, ¼ full-scale, etc. Assuming the signal range does not change, the qualification histogram should have more than half non-zero bins.

Referring back to FIG. 16, the flow diagram in FIG. 16 illustrates the one or more checks which can be performed in 1508 on the qualification histogram of FIG. 15. The qualifier may be implemented in a way to err on the side of caution to let data blocks fail qualification even when it is not a result of a coherent input frequency.

In 1602, the qualifier can determine that the data block fails qualification in response to determining that a number of empty bins in the qualifying histogram exceeds a threshold. For instance, if a number of empty bins exceeds half of the total number of bins, the data block would fail qualification. This check can verify that the range calculation was correct and that the input signal didn't shift in signal range (since the qualification histogram is generated based on the rest of the output values not used in the range histogram). This check can also verify quickly if the qualification histogram is indeed one that exhibits a lot of clustering with many empty bins (an indicator of a coherent input frequency). In some embodiments, a quick clustering check 1704 of FIG. 17 can determine whether a number of empty bins of the qualifying histogram exceeds a threshold.

In 1604, the qualifier can determine that the data block fails qualification in response to determining that a count value in a highest bin or a count value in a lowest bin in the qualifying histogram exceeds a threshold. This check to make sure the range set for the qualifying histogram is appropriate. The intuition is that these edge cases, where the highest bin or the lower bin has an unexpectedly high bin count value, could indicate that the signal is smaller or larger than the range estimated from the range histogram. Referring back to the example given for the range estimator 1702, note the top bin of the qualification histogram would get hit whenever the signal is "greater than 248" (all values above 256 go into the top bin). If the signal level changes or an error in the range estimation was made, then our top bin of the qualification histogram can get hit a lot of times, possibly 50%+ or so. On the other side of the qualification histogram, if the signal is actually smaller than the estimated range, the bottom bin could get a lot of hits. While these edge cases may cause the variability measurement test to fail by themselves, the additional check in 1604 can check the count values for the top or bottom bin to be on the safer side. In some embodiments, if a predetermined percentage of the total count are in the top or bottom bin of the qualifying histogram, the data block would fail the qualification (because a bad range was used.) In some embodiments, a bad range check 1706 of FIG. 16 can determine if a count value of a highest bin of the qualifying histogram or a count value of a lowest bin of the qualifying histogram exceeds a threshold. The threshold can be programmable.

In 1506, the qualifier can determine that the data block fails qualification in response to determining that the variability measurement of the qualifying histogram exceeds a programmable threshold. For instance, the qualifier can determine the variability measurement based on Equation 3. In some cases, the bin count values are truncated to reduce complexity, and the variability measurement is computed based on an expected value of the truncated bin count values. For instance, if the bin count values of a 5-bit histogram (32 bins) are truncated to 11 bits, then the expected value is $$\mu = \frac{2^{11}}{32} = \frac{2048}{32} = 64.$$

In some embodiments, a clustering measurement check 1708 of FIG. 17 can determine the qualification result by comparing the amount of clustering (e.g., the variability measurement of Equation 3) against a programmable threshold.

Examples

Example 1 is a method for preventing performance degradation of blind calibration of an interleaving error of a plurality of time-interleaved analog-to-digital converters, the method comprising: capturing a data block comprising output values generated by one of the plurality of time-interleaved analog-to-digital converters; qualifying the data block by evaluating a variability measurement of a qualification histogram generated from the data block; in response to determining that the data block fails qualification, skipping an update of the blind calibration of the interleaving error; and in response to determining that the data block qualifies, using the data block to update the blind calibration of the interleaving error.

In Example 2, the method of Example 1 can optionally include qualifying the data block comprising: determining a signal range based on the data block.

In Example 3, the method of Example 2 can optionally include qualifying the data block comprising: setting a range for the qualification histogram based on the signal range.

In Example 4, the method of Example 2 or 3 can optionally include qualifying the data block comprising: setting one or more programmable thresholds for evaluating the variability measurement of the qualification histogram based on the signal range.

In Example 5, the method of any one of Examples 1-4 can optionally include qualifying the data block comprising: generating a range histogram based on a first part of the data block; estimating a signal range based on the range histogram; and generating a qualifying histogram according to the signal range based on a second part of the data block.

In Example 6, the method of any one of Examples 1-5 can optionally include qualifying the data block comprising: determining that the data block fails qualification in response to determining that a number of empty bins in the qualifying histogram exceeds a threshold.

In Example 7, the method of any one of Examples 1-6 can optionally include qualifying the data block comprising: determining that the data block fails qualification in response to determining that a count value in a highest bin or a count value in a lowest bin in the qualifying histogram exceeds a threshold.

In Example 8, the method of any one of Examples 1-7 can optionally include qualifying the data block comprising: determining that the data block fails qualification in response to determining that the variability measurement of the qualifying histogram exceeds a programmable threshold.

In Example 9, the method of any one of Examples 1-8 can optionally include qualifying the data block comprising: computing a sum of distances of count values in bins of the qualifying histogram from a mean count value of the qualifying histogram. In some cases, the mean count value of the qualifying histogram is an expected value for count values of the qualifying histogram.

In Example 10, the method of any one of Examples 1-9 can optionally include qualifying the data block comprising: comparing the qualifying histogram against an expected histogram; and evaluating the variability measurement based on the comparison.

Example 11 is a blind calibration system for calibrating an interleaving error of a plurality of time-interleaved analog-to-digital converters, the blind calibration system comprising: a histogram function to generate a qualification histogram based on values generated by one of the plurality of time-interleaved analog-to-digital converters; a qualifier to measure an amount of clustering in the qualification histogram and output a qualification result based on the amount of clustering; and an interleaving error calibration engine controllable by a qualification result from the qualifier.

In Example 12, the blind calibration system of Example 11 can optionally include the qualifier comprising: a range estimator to determine a signal range estimate of the values generated by the one of the plurality of time-interleaved analog-to-digital converters and configuring a range of the qualification histogram based on the signal range estimate.

In Example 13, the blind calibration system of Example 11 or 12 can optionally include the qualifier determining the qualification result by comparing the amount of clustering against a programmable threshold.

In Example 14, the blind calibration system of any one of Examples 11-13 can optionally include the qualifier determining the amount of clustering by adding differences in count values between the qualifying histogram and an expected histogram.

In Example 15, the blind calibration system of any one of Examples 11-14 can optionally include the qualifier comprising: a quick clustering check to determine whether a number of empty bins of the qualifying histogram exceeds a threshold.

In Example 16, the blind calibration system of any one of Examples 11-15 can optionally include the qualifier comprising: a bad range check to determine if a count value of a highest bin of the qualifying histogram or a count value of a lowest bin of the qualifying histogram exceeds a threshold.

In Example 17, the blind calibration system of any one of Examples 11-16 can optionally include the qualification result dictating whether the interleaving error calibration engine is to hold a previous value of an interleaving error correction coefficient or to update an interleaving error correction coefficient.

In Example 18, the blind calibration system of any one of Examples 11-17 can optionally include the interleaving error calibration engine comprising: an interleaving error extractor to derive the interleaving error and update an interleaving error correction coefficient based on the interleaving error; and an interleaving error correction block to apply interleaving error correction coefficient to reduce the interleaving error.

Example 19 is an analog-to-digital converter, comprising: a plurality of time-interleaved means for sampling an analog input signal according a rotational sequence; means for extracting an interleaving error by observing values generated by one of the plurality of time-interleaved means; and digital processing means for detecting whether the analog input signal meets one or more qualifying conditions and outputting a qualification result to control a state of the means for extracting the interleaving error.

In Example 20, the analog-to-digital converter of Example 19 can optionally include the digital processing means comprising: means for evaluating a statistic of a qualifying histogram generated based on the values generated by the one of the plurality of time-interleaved means.

Example 21 is an apparatus for performing any one of the methods described herein.

Variations and Implementations

Note that $$\frac{F_s}{K}$$

is a general problem case (as seen in Equation 2) where there are only K discrete data points to be sampled. Within this general problem case, there are two scenarios. First scenario is that K=k*M, where k and M are integers, and M is the number of sub-ADCs. Second scenario is other values of K.

In the first scenario, the input signal is synchronous or coherent not just to the ADC, but to the sub-ADCs as well. This means that each sub-ADC samples 1/M of the discrete K data points in the signal. For example, with two sub-ADCs (M=2), and $$\frac{F_s}{2}$$

as the input frequency, there are K=2 discrete data points (and one amplitude points). Since K=2=1*M, each sub-ADC samples 1 of the 2 discrete data points, every time. With $$\frac{F_s}{8}$$

as the input frequency, each sub-ADC samples 4 of the 8 discrete data points (or 2 of the 4 amplitude points).

In the second scenario, the input signal is not synchronous/coherent to the sub-ADC. This means that on average, even though there are only K discrete data points in the s signal, each sub-ADC samples all K data points equally over time, so calibration may not be affected. A qualifier may still fail such a scenario if K is very small (e.g., K=3), since the qualifier looks at the "richness" or diversity of amplitude values in the qualification histogram of a single sub-ADC. If desired, the qualifier can be implemented to separately qualify multiple sub-ADCs, and compare the qualification results to detect such a case. However, for efficiency and simplicity reasons, a qualifier can be designed to fail such a case to be more cautious (assuming that the ADC will not be seeing such input frequencies for an extended period of time.)

In some embodiments, an ADC (e.g., one illustrated in FIG. 1) can include a plurality of time-interleaved means (e.g., subADC[0] 112, subADC[1] 114, . . . and subADC [M−1] 116) for sampling an analog input signal according a rotational sequence. The ADC further includes means for extracting an interleaving error (e.g., interleaving error calibration engine 150 of FIG. 1) by observing values generated by one of the plurality of time-interleaved means. The ADC can further include digital processing means for detecting whether the analog input signal meets one or more qualifying conditions (e.g., the absence of a coherent input frequency) and outputting a qualification result to control a state of the means for extracting the interleaving error (e.g., qualifier 122 of FIGS. 1 and 17). The qualifying conditions are selected to reduce the risk of the background/blind calibrations from diverging or failing, e.g., to prevent a "bad" calibration update based on "bad" data. The digital processing means can include means for evaluating a statistic of the qualifying histogram generated based on the values generated by the one of the plurality of time-interleaved means. The digital processing means can include one or more of: dedicated digital hardware, digital logic, and one or more processors configured to execute instructions to carry out the methods described herein.

In some embodiments, the variability measurement could be computed over only the non-zero bins of the qualifying histogram with a corresponding mean of the bin count values for the non-zero bins.

In some embodiments, increasing the number of histogram bins adds complexity, but can increase the accuracy of detecting coherent input frequencies.

In some embodiments, adjusting the scaling of output values going into the qualifying histogram to values other than powers of 2 (e.g., the equivalent of grabbing most significant bits) adds complexity, but can increase accuracy of detecting coherent frequencies.

In some cases, instead of using a histogram, it is possible to run an auto-correlation to detect a coherent input frequencies. The qualifier can then compare peaks of the auto-correlation to a programmable threshold. However, this auto-correlation scheme can be much more expensive in terms of power and area than using a coarse histogram.

In some cases, it is possible to implement a notch filter in front of the interleaving error calibration engine averagers to filter out the coherent input frequencies to address the issue of divergence. However, a notch filter that covers all the coherent input frequencies can easily require hundreds of filter taps, and can also create nulls and gain variations between the nulls which can exacerbate other issues.

In some cases, the time-interleaved ADCs has a reference ADC to help the background calibration scheme to converge to the optimal interleaving error correction coefficient. The reference ADC, when it is selected to sample the analog input, can sample the analog input signal at substantially the same time with another selected sub-ADC. While this can help address the issue of the background calibration discussed herein, it necessitates an additional ADC and additional clocking circuitry to select the reference ADC appropriately. Therefore, it is not always practical to include a reference ADC. When a reference ADC is not practical, then the schemes to address problematic input conditions are beneficial in preventing the calibrations from failing.

ADCs can be found in many places such as broadband communication systems, audio systems, receiver systems, etc. ADCs can translate analog electrical signals representing real-world phenomenon, e.g., light, sound, temperature or pressure for data processing purposes. Designing an ADC is a non-trivial task because each application may have different needs in performance, power, cost and size. ADCs are used in a broad range of applications including communications, energy, healthcare, instrumentation and measurement, motor and power control, industrial automation and aerospace/defense.

The features discussed herein can be applicable to converters being used in many different applications. The features described herein are particularly applicable to systems where linearity is important. Various exemplary applications include medical systems, scientific instrumentation, transportation systems, aerospace systems, wireless and wired communications, radar, industrial process control, audio and video equipment, consumer devices, and other converter-based systems.

Parts of various apparatuses for qualifying a data block can include electronic circuitry to perform the functions described herein. In some cases, one or more parts of the apparatus can be provided by an on-chip processor or controller specially configured for carrying out the functions described herein. For instance, the on-chip processor or controller may include one or more application specific components, or may include programmable logic gates which are configured to carry out the functions describe herein. The circuitry can operate in analog domain, digital domain, or in a mixed-signal domain (but preferably in the digital domain). In some instances, the processor or controller may be configured to carrying out the functions described herein by executing one or more instructions stored on a non-transitory computer medium accessible by the on-chip processor or controller.

In one example embodiment, the chip (or integrated circuit) providing the converter and the on-chip processor may be provided on a board of an associated electronic device. The board can be a general circuit board that can hold various components of the internal electronic system of the electronic device and, further, provide connectors for other peripherals. For instance, the chip having the converter and the on-chip processor can communicate with the components of the associated electronic device (e.g., signal generators, processors, memory, transmitters, receivers, etc.). More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the examples and appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the examples and appended claims. The description and drawings are, accordingly, to be regarded in an illustrative rather than in a restrictive sense.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions described herein, illustrate only some of the possible functions that may be executed by, or within, systems illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the examples and appended claims. Note that all optional features of the apparatus described above may also be implemented with respect to the method or process described herein and specifics in the examples may be used anywhere in one or more embodiments.

What is claimed is:

1. A method for preventing performance degradation of blind calibration of an interleaving error of a plurality of time-interleaved analog-to-digital converters, the method comprising:
    capturing a data block comprising output values generated by one of the plurality of time-interleaved analog-to-digital converters;
    qualifying the data block by evaluating a variability measurement of a qualification histogram generated from the data block;
    in response to determining that the data block fails qualification, skipping an update of the blind calibration of the interleaving error; and
    in response to determining that the data block qualifies, using the data block to update the blind calibration of the interleaving error.

2. The method of claim 1, wherein qualifying the data block comprises:
    determining a signal range based on the data block.

3. The method of claim 2, wherein qualifying the data block comprises:
    setting a range for the qualification histogram based on the signal range.

4. The method of claim 2, wherein qualifying the data block comprises:
    setting one or more programmable thresholds for evaluating the variability measurement of the qualification histogram based on the signal range.

5. The method of claim 1, wherein qualifying the data block comprises:
    generating a range histogram based on a first part of the data block;
    estimating a signal range based on the range histogram; and
    generating a qualifying histogram according to the signal range based on a second part of the data block.

6. The method of claim 1, wherein qualifying the data block comprises:
    determining that the data block fails qualification in response to determining that a number of empty bins in the qualifying histogram exceeds a threshold.

7. The method of claim 1, wherein qualifying the data block comprises:
    determining that the data block fails qualification in response to determining that a count value in a highest bin or a count value in a lowest bin in the qualifying histogram exceeds a threshold.

8. The method of claim 1, wherein qualifying the data block comprises:
    determining that the data block fails qualification in response to determining that the variability measurement of the qualifying histogram exceeds a programmable threshold.

9. The method of claim 1, wherein qualifying the data block comprises:
    computing a sum of distances of count values in bins of the qualifying histogram from a mean count value of the qualifying histogram.

10. The method of claim 1, wherein qualifying the data block comprises:
    comparing the qualifying histogram against an expected histogram; and
    evaluating the variability measurement based on the comparison.

11. A blind calibration system for calibrating an interleaving error of a plurality of time-interleaved analog-to-digital converters, the blind calibration system comprising:
    a histogram function to generate a qualification histogram based on values generated by one of the plurality of time-interleaved analog-to-digital converters;
    a qualifier to measure an amount of clustering in the qualification histogram and output a qualification result based on the amount of clustering; and
    an interleaving error calibration engine controllable by a qualification result from the qualifier.

12. The blind calibration system of claim 11, wherein the qualifier comprises:
    a range estimator to determine a signal range estimate of the values generated by the one of the plurality of time-interleaved analog-to-digital converters and configuring a range of the qualification histogram based on the signal range estimate.

13. The blind calibration system of claim 11, wherein the qualifier determines the qualification result by comparing the amount of clustering against a programmable threshold.

14. The blind calibration system of claim 11, wherein the qualifier determines the amount of clustering by adding differences in count values between the qualifying histogram and an expected histogram.

15. The blind calibration system of claim 11, wherein the qualifier comprises:
    a quick clustering check to determine whether a number of empty bins of the qualifying histogram exceeds a threshold.

16. The blind calibration system of claim 11, wherein the qualifier comprises:
    a bad range check to determine if a count value of a highest bin of the qualifying histogram or a count value of a lowest bin of the qualifying histogram exceeds a threshold.

17. The blind calibration system of claim 11, wherein the qualification result dictates whether the interleaving error calibration engine is to hold a previous value of an interleaving error correction coefficient or to update an interleaving error correction coefficient.

18. The blind calibration system of claim 11, wherein the interleaving error calibration engine comprises:
    an interleaving error extractor to derive the interleaving error and update an interleaving error correction coefficient based on the interleaving error; and
    an interleaving error correction block to apply interleaving error correction coefficient to reduce the interleaving error.

19. An analog-to-digital converter, comprising:
    a plurality of time-interleaved means for sampling an analog input signal according a rotational sequence;
    means for extracting an interleaving error by observing values generated by one of the plurality of time-interleaved means; and
    digital processing means for determining a level of variability in the values generated by the one of the plurality of time-interleaved means and outputting a qualification result based on the level of variability to control a state of the means for extracting the interleaving error.

20. The analog-to-digital converter of claim 19, wherein the digital processing means comprises:
   means for evaluating a statistic of a qualifying histogram generated based on the values generated by the one of the plurality of time-interleaved means.

21. A method for preventing calibration divergence of an interleaving error of a plurality of time-interleaved analog-to-digital converters, the method comprising:
   capturing a data block comprising output values generated by one of the plurality of time-interleaved analog-to-digital converters;
   determining whether the data block is a result of an input signal to the plurality of time-interleaved analog-to-digital converter having an input frequency that is coherent to the one of the plurality of time-interleaved analog-to-digital converters; and
   in response to a determination that the data block is the result of an input signal having the input frequency that is coherent to the one of the plurality of time-interleaved analog-to-digital converters, skipping an update of a calibration of the interleaving error.

22. The method of claim 21, further comprising:
   otherwise, using the data block to update the calibration of the interleaving error.

23. The method of claim 21, wherein determining whether the input signal is coherent to the one of the time-interleaved analog-to-digital converters comprises:
   determining a level of diversity in the data block; and
   comparing the level of diversity against a threshold.

24. The method of claim 21, wherein determining whether the input signal is coherent to the one of the time-interleaved analog-to-digital converters comprises:
   determining an amount of clustering in the data block; and
   comparing the amount of clustering against a threshold.

* * * * *